(12) United States Patent
Purayath et al.

(10) Patent No.: US 8,207,036 B2
(45) Date of Patent: Jun. 26, 2012

(54) METHOD FOR FORMING SELF-ALIGNED DIELECTRIC CAP ABOVE FLOATING GATE

(75) Inventors: Vinod Robert Purayath, Santa Clara, CA (US); George Matamis, San Jose, CA (US); Takashi Orimoto, Sunnyvale, CA (US); Henry Chien, San Jose, CA (US); James K. Kai, Santa Clara, CA (US)

(73) Assignee: SanDisk Technologies Inc., Plano, TX (US)

( * ) Notice: Subject to any disclaimer, the term of this patent is extended or adjusted under 35 U.S.C. 154(b) by 361 days.

(21) Appl. No.: 12/242,857

(22) Filed: Sep. 30, 2008

(65) Prior Publication Data
US 2010/0081267 A1    Apr. 1, 2010

(51) Int. Cl.
*H01L 21/336* (2006.01)
*H01L 21/8238* (2006.01)
*H01L 21/3205* (2006.01)
*H01L 21/4763* (2006.01)
*H01L 29/788* (2006.01)

(52) U.S. Cl. ........ 438/266; 438/211; 438/257; 438/594; 257/316; 257/317; 257/E29.3

(58) Field of Classification Search .......... None
See application file for complete search history.

(56) References Cited

U.S. PATENT DOCUMENTS

| | | | |
|---|---|---|---|
| 5,104,819 A | 4/1992 | Freiberger et al. | |
| 5,229,312 A | 7/1993 | Mukherjee et al. | |
| 5,923,976 A | 7/1999 | Kim | |
| 6,008,091 A | 12/1999 | Gregor et al. | |
| 6,069,041 A | 5/2000 | Tanigami et al. | |
| 6,093,607 A | 7/2000 | Hsieh et al. | |
| 6,127,227 A | 10/2000 | Lin et al. | |
| 6,362,045 B1 | 3/2002 | Lin et al. | |
| 6,753,224 B1 | 6/2004 | Lin et al. | |
| 6,855,994 B1 | 2/2005 | King et al. | |
| 7,015,534 B2 * | 3/2006 | Colombo | 257/314 |
| 7,026,684 B2 | 4/2006 | Sakuma et al. | |
| 7,202,125 B2 | 4/2007 | Pham et al. | |
| 7,224,019 B2 | 5/2007 | Hieda et al. | |
| 7,253,470 B1 | 8/2007 | Liu et al. | |

(Continued)

OTHER PUBLICATIONS

Office Action dated Jul. 8, 2009 in U.S. Appl. No. 12/170,321.

(Continued)

*Primary Examiner* — Nathan W. Ha
*Assistant Examiner* — Michael Jung
(74) *Attorney, Agent, or Firm* — Vierra Magen Marcus & DeNiro LLP

(57) ABSTRACT

A method for fabricating a non-volatile storage element. The method comprises forming a layer of polysilicon floating gate material over a substrate and forming a layer of nitride at the surface of the polysilicon floating gate material. Floating gates are formed from the polysilicon floating gate material. Individual dielectric caps are formed from the nitride such that each individual nitride dielectric cap is self-aligned with one of the plurality of floating gates. An inter-gate dielectric layer is formed over the surface of the dielectric caps and the sides of the floating gates. Control gates are then formed with the inter-gate dielectric layer separating the control gates from the floating gates. The layer of nitride may be formed using SPA (slot plane antenna) nitridation. The layer of nitride may be formed prior to or after etching of the polysilicon floating gate material to form floating gates.

13 Claims, 19 Drawing Sheets

U.S. PATENT DOCUMENTS

| | | | |
|---|---|---|---|
| 7,279,735 | B1 | 10/2007 | Yu et al. |
| 7,332,408 | B2 | 2/2008 | Violette |
| 2005/0087795 | A1* | 4/2005 | Sakuma et al. ............... 257/315 |
| 2006/0231884 | A1 | 10/2006 | Yonemochi et al. |
| 2007/0210338 | A1 | 9/2007 | Orlowski |
| 2007/0257305 | A1 | 11/2007 | Sasago et al. |
| 2007/0298568 | A1* | 12/2007 | Mokhlesi ...................... 438/257 |
| 2008/0061353 | A1* | 3/2008 | Oh et al. ....................... 257/315 |
| 2008/0149987 | A1* | 6/2008 | Alapati et al. ................ 257/315 |
| 2008/0171406 | A1* | 7/2008 | Orimoto et al. ............... 438/129 |
| 2008/0185634 | A1 | 8/2008 | Li et al. |
| 2008/0191262 | A1 | 8/2008 | Chang et al. |
| 2008/0248622 | A1* | 10/2008 | Matamis et al. .............. 438/261 |
| 2009/0140315 | A1 | 6/2009 | Kuniya |
| 2009/0225602 | A1 | 9/2009 | Sandhu et al. |

OTHER PUBLICATIONS

International Search Report and Written Opinion dated Sep. 14, 2009 in PCT Application No. PCT/US2009/049620.

Notice of Allowance and Fee(s) Due dated Oct. 6, 2009 in U.S. Appl. No. 12/170,327.

Response to Office Action filed Dec. 8, 2009 in U.S. Appl. No. 12/170,321.

Office Action dated Jan. 12, 2010 in U.S. Appl. No. 12/170,327.

Office Action dated Mar. 5, 2010 in U.S. Appl. No. 12/170,321.

Notice of Allowance and Fee(s) Due dated Jan. 5, 2011, U.S. Appl. No. 12/170,321, filed Jul. 9, 2008.

Notice of Allowance and Fee(s) Due dated Jan. 18, 2011, U.S. Appl. No. 12/170,321, filed Jul. 9, 2008.

International Preliminary Report on Patentability & The Written Opinion of the International Searching Authority dated Jan. 11, 2011, Patent Cooperation Treaty, PCT Application No. PCT/US2009/049620, filed Jul. 2, 2009.

Response C to Office action dated Dec. 15, 2010, U.S. Appl. No. 12/170,321, filed Jul. 9, 2008.

Response B to Office Action dated Dec. 29, 2010, U.S. Appl. No. 12/170,321, filed Jul. 9, 2008.

Response to Office Action dated Sep. 7, 2010 in U.S. Appl. No. 12/170,321, filed Jul. 9, 2008.

Final Office Action dated Sep. 15, 2010 in U.S. Appl. No. 12/170,321, filed Jul. 9, 2008.

Final Office Action dated Sep. 29, 2010 in U.S. Appl. No. 12/170,327, filed Jul. 9, 2008.

Response to Office Action filed Jul. 12, 2010 in U.S. Appl. No. 12/170,327.

* cited by examiner

METHOD FOR FORMING SELF-ALIGNED DIELECTRIC CAP ABOVE FLOATING GATE

CROSS-REFERENCE TO RELATED APPLICATIONS

The following applications are cross-referenced and incorporated by reference herein in their entirety:

U.S. patent application Ser. No. 12/170,321, entitled "METHOD OF FORMING DIELECTRIC LAYER ABOVE FLOATING GATE FOR REDUCING LEAKAGE CURRENT," by James Kai, et al., now U.S. Pat. No. 7,915,124, filed on Jul. 9, 2008; and U.S. patent application Ser. No. 12/170,327, entitled "DIELECTRIC LAYER ABOVE FLOATING GATE FOR REDUCING LEAKAGE CURRENT," by Dana Lee, et al., now U.S. Pat. No. 7,919,809, filed on Jul. 9, 2008.

BACKGROUND OF THE INVENTION

1. Field of the Invention

The present invention relates to non-volatile memory devices.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Typical EEPROMs and flash memories utilize a memory cell with a floating gate that is provided above a channel region in a semiconductor substrate. The floating gate is separated from the channel region by a dielectric region. For example, the channel region is positioned in a p-well between source and drain regions. A control gate is separated from the floating gate by another dielectric region (inter-gate or inter poly dielectric). The threshold voltage of the memory cell is controlled by the amount of charge that is retained on the floating gate. That is, the level of charge on the floating gate determines the minimum amount of voltage that must be applied to the control gate before the memory cell is turned on to permit conduction between its source and drain.

Some EEPROM and flash memory devices have a floating gate that is used to store two ranges of charges and, therefore, the memory cell can be programmed/erased between two states (e.g. a binary memory cell). A multi-bit or multi-state flash memory cell is implemented by identifying multiple, distinct threshold voltage ranges within a device. Each distinct threshold voltage range corresponds to predetermined values for the set of data bits. To achieve proper data storage for a multi-state cell, the multiple ranges of threshold voltage levels should be separated from each other by sufficient margin so that the level of the memory cell can be read, programmed or erased in an unambiguous manner.

When programming typical flash memory devices, a program voltage is applied to the control gate and the bit line is grounded. Due to capacitive coupling between the control gate and floating gate, the program voltage on the control gate is coupled to the floating gate causing a floating gate voltage. The floating gate voltage causes electrons from the channel to be injected into the floating gate. When electrons accumulate in the floating gate, the floating gate becomes negatively charged and the threshold voltage of the memory cell as seen from the control gate is raised. In order to preserve the programmed state of the memory cell, the charge on the floating gate needs to be maintained over time. However, it is possible for charge to leak through the inter-poly dielectric from the floating gate to the control gate, which is referred to as leakage current.

In recent flash memory technologies, short program/erase times and low operating voltages are the main obstacles to overcome in order to realize high speed and density, and low power operation. Thus, it has become increasingly necessary to increase the capacitive coupling between the floating gate and the control gate of the memory cell, while simultaneously inhibiting electrons from escaping from the floating gate to the control gate. The control gate to floating gate capacitance, which affects the coupling ratio, depends upon the thickness of the inter-poly dielectric (IPD) between the two gates and the relative permittivity or dielectric constant, K, of the IPD. One technique to achieve a high coupling ratio is to use a thin IPD. However, if the IPD is too thin, the leakage current can become undesirably large.

As non-volatile memory structures become smaller, leakage current is becoming a more difficult problem. One reason for the leakage current problem is the strength of the electric field that occurs in various portions of the IPD when a voltage is applied to the control gate. In particular, the electric field is enhanced in certain regions of the IPD, which results in greater leakage current. Referring to FIG. 1A, the electric field is the strongest in the IPD 106 near sharp corners of the floating gate 102 and control gate 104. In the region near the corner of the IPD 106 that is circled, the magnitude of the electric field is proportional to $1/A$, where A is the radius of curvature of the corner of the floating gate 102. Note that a sharp corner corresponds to a very small radius of curvature, and hence a strong electric field.

In order to reduce the strength of the electric field in the IPD 106 at the corner of the floating gate 102, the radius of curvature of the top of the floating gate 102 can be increased, as depicted in FIG. 1B. Note this also changes the curvature of the control gate 104. By reducing the strength of the electric field, the leakage current is reduced. However, in order to continue to scale down the size of device structures, it is desirable to narrow the width of the floating gate 102, as depicted in FIG. 1C. Note that the rounding of the polysilicon floating gate 102 extends completely across the top of the floating gate 102 of FIG. 1C. The amount of rounding of the floating gate 102 that is possible is limited by the width of the floating gate 102. That is, the largest possible radius of curvature (A) is limited to half the width of the floating gate 102. Note that if the width (2A) of the floating gate 102 is further reduced, the maximum possible radius of curvature is also further reduced. Therefore, as feature sizes of memory cells continue to be reduced, the electric field in the IPD 106 and hence leakage current becomes more difficult to deal with.

One technique to reduce the electric field is to form the IPD 106 with a thin film having a high dielectric constant. However, such films are difficult to work with and hence undesirable. For example, paraelectric materials have dielectric constants that are usually at least two orders of magnitude above that of silicon dioxide, but several problems limit their use as gate dielectrics. One such problem is oxygen diffusion. During high temperature processes associated with semiconductor fabrication, oxygen diffuses from the IPD 106 to the interface between the IPD 106 and the floating gate 102 and control gate 104 that sandwich the IPD 106, thus forming an undesirable oxide layer that decreases the overall capacitance of the dielectric system. Therefore, the effect of the high dielectric constant paraelectric material is reduced.

Metal oxides have also been proposed as high K materials for flash memory devices. Metal oxides, in particular aluminum oxide ($Al_2O_3$), have a low leakage current. Moreover, metal oxides have high temperature endurance for process integration. However, because the deposited high dielectric metal oxides have non-stoichiometric composition, they are prone to large electrical defects or traps in the bulk of the dielectric and at the dielectric/semiconductor interface. These defects or traps enhance conduction through the dielectric and reduce the breakdown strength of the dielectric.

Another technique to reduce the electric field in the IPD is to increase the thickness of the IPD 106. However, increasing the thickness of the IPD 106 tends to reduce the capacitive coupling between the floating gate 102 and the control gate 106, which is undesirable for reasons previously discussed. In general, increasing the IPD 106 thickness tends to fail when the radius of curvature is less than the thickness of the IPD 106 or when the thickness of the IPD 106 approaches the dimension ("feature size") of the memory cell.

SUMMARY OF THE INVENTION

Embodiments in accordance with the disclosure, roughly described, pertain to techniques for fabricating memory cells and memory arrays. The memory cell has a dielectric cap above a floating gate. In one embodiment, the dielectric cap resides between the floating gate and a conformal IPD layer. The dielectric cap reduces the leakage current between the floating gate and a control gate. The dielectric cap achieves this reduction by reducing the strength of the electric field at the top of the floating gate, which is where the electric field would be strongest without the dielectric cap for a floating gate having a narrow stem.

One embodiment is a method for fabricating a non-volatile storage element. The method comprises forming a layer of gate oxide above a substrate. Next, a layer of polysilicon floating gate material is formed over the substrate and a layer of nitride is formed at the surface of the polysilicon floating gate material. Floating gates are formed from the polysilicon floating gate material. Individual dielectric caps are formed from the nitride such that each individual nitride dielectric cap is self-aligned with one of the plurality of floating gates. An inter-gate dielectric layer is formed over the surface of the dielectric caps and the sides of the floating gates. Control gates are then formed with the inter-gate dielectric layer separating the control gates from the floating gates. In one implementation, the layer of nitride is formed using SPA (slot plane antenna) nitridation. In one implementation, the layer of nitride is formed prior to any etching of the polysilicon floating gate material to form floating gates. In another implementation, the layer of nitride is formed after etching the polysilicon floating gate material.

One embodiment in which the layer of nitride is formed prior to any etching of the polysilicon floating gate material is performed as follows. A layer of gate oxide is formed over a substrate. A polysilicon floating gate material is formed over the gate oxide. A layer of nitride is formed over the polysilicon floating gate material. Portions of the polysilicon floating gate material and the nitride are etched to form floating gates with nitride caps. An inter-gate dielectric layer is formed over the surface of the nitride caps and sides of the floating gates. Control gates are formed with the inter-gate dielectric layer separating the control gates from the floating gates.

One embodiment in which the layer of nitride is formed after some etching of the polysilicon floating gate material is performed as follows. A layer of gate oxide is formed above a substrate. A layer of polysilicon floating gate material is formed over the gate oxide. Portions of the polysilicon floating gate material, the gate oxide, and the substrate are etched to form shallow trench isolation regions and pillars. The shallow trench isolation regions separate the pillars. The pillars comprise remaining portions of the polysilicon floating gate material and gate oxide. Insulating material is deposited in the shallow trench isolation regions. Nitride regions are formed selectively over the top surfaces of the remaining portions of the polysilicon floating gate material but not over the insulating material. An inter-gate dielectric layer is formed over the nitride regions and sides of the floating gates. Control gates are formed with the inter-gate dielectric layer separating the control gates from the floating gates.

These and other objects and advantages will appear more clearly from the following description in which various embodiments have been set forth in conjunction with the drawings.

DETAILED DESCRIPTION

Figure 1A:
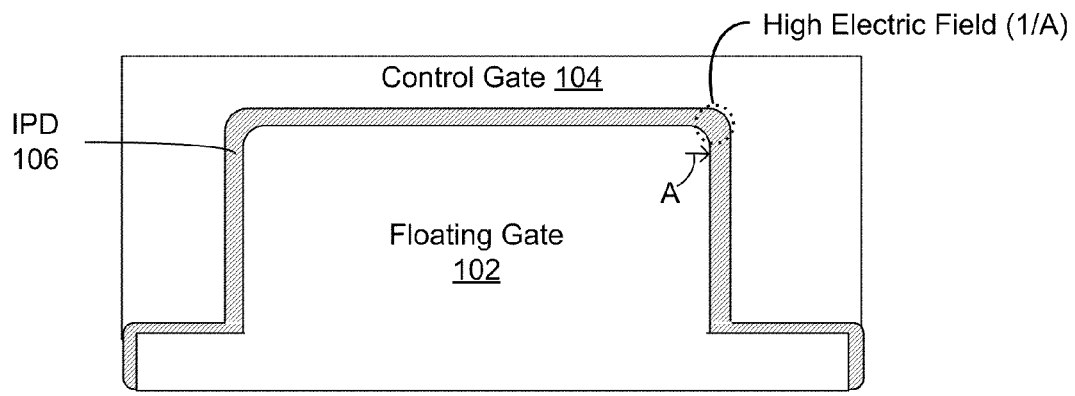
FIG. 1A, FIG. 1B, and FIG. 1C depict the structure of different floating gate/control gate interfaces.
Figure 1B:
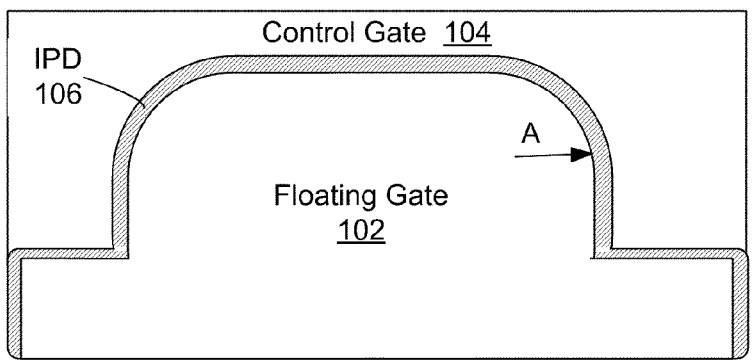
Figure 1C:
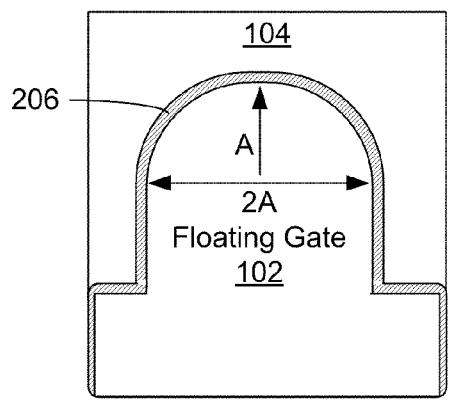
Figure 2:
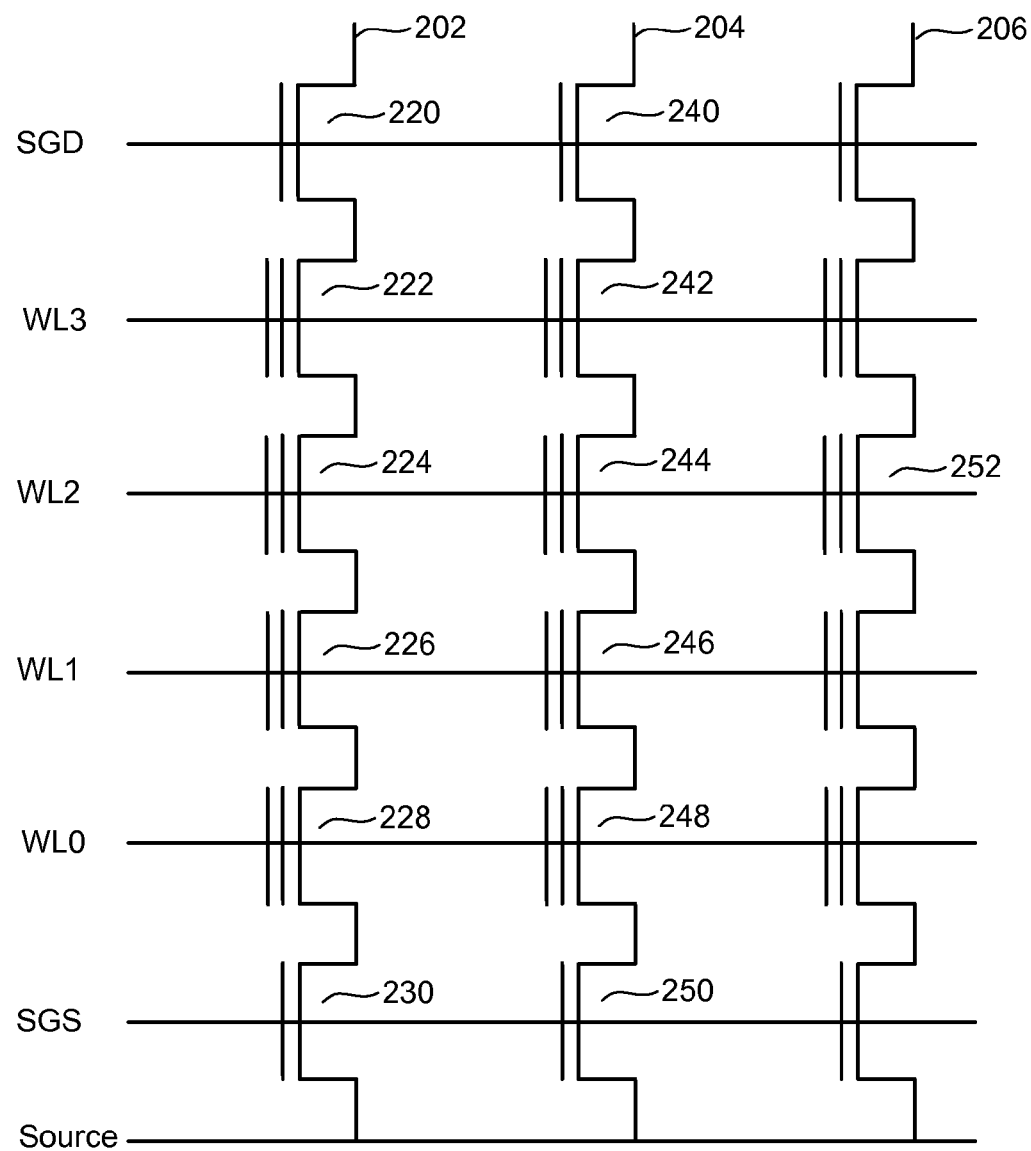
FIG. 2 is a circuit diagram depicting three NAND strings.

One example of a flash memory system uses the NAND structure, which includes arranging multiple floating gate transistors in series between two select gates. The transistors in series and the select gates are referred to as a NAND string. A typical architecture for a flash memory system using a NAND structure will include several NAND strings. For example, FIG. 2 shows three NAND strings 202, 204 and 206 of a memory array having many more NAND strings. Each of the NAND strings of FIG. 2 includes two select transistors and four memory cells. For example, NAND string 202 includes select transistors 220 and 230, and memory cells 222, 224, 226 and 228. NAND string 204 includes select transistors 240 and 250, and memory cells 242, 244, 246 and 248. Each NAND string is connected to the source line by its select transistor (e.g. select transistor 230 and select transistor 250). A selection line SGS is used to control the source side select gates. The various NAND strings are connected to respective bit lines by select transistors 220, 240, etc., which are controlled by select line SGD. In other embodiments, the select lines do not necessarily need to be in common. Word line WL3 is connected to the control gates for memory cell 222 and memory cell 242. Word line WL2 is connected to the control gates for memory cell 224, memory cell 244, and memory cell 252. Word line WL1 is connected to the control gates for memory cell 226 and memory cell 246. Word line WL0 is connected to the control gates for memory cell 228 and memory cell 248. As can be seen, each bit line and the respective NAND string comprise the columns of the array of memory cells. The word lines (WL3, WL2, WL1 and WL0) comprise the rows of the array.

Figure 3:
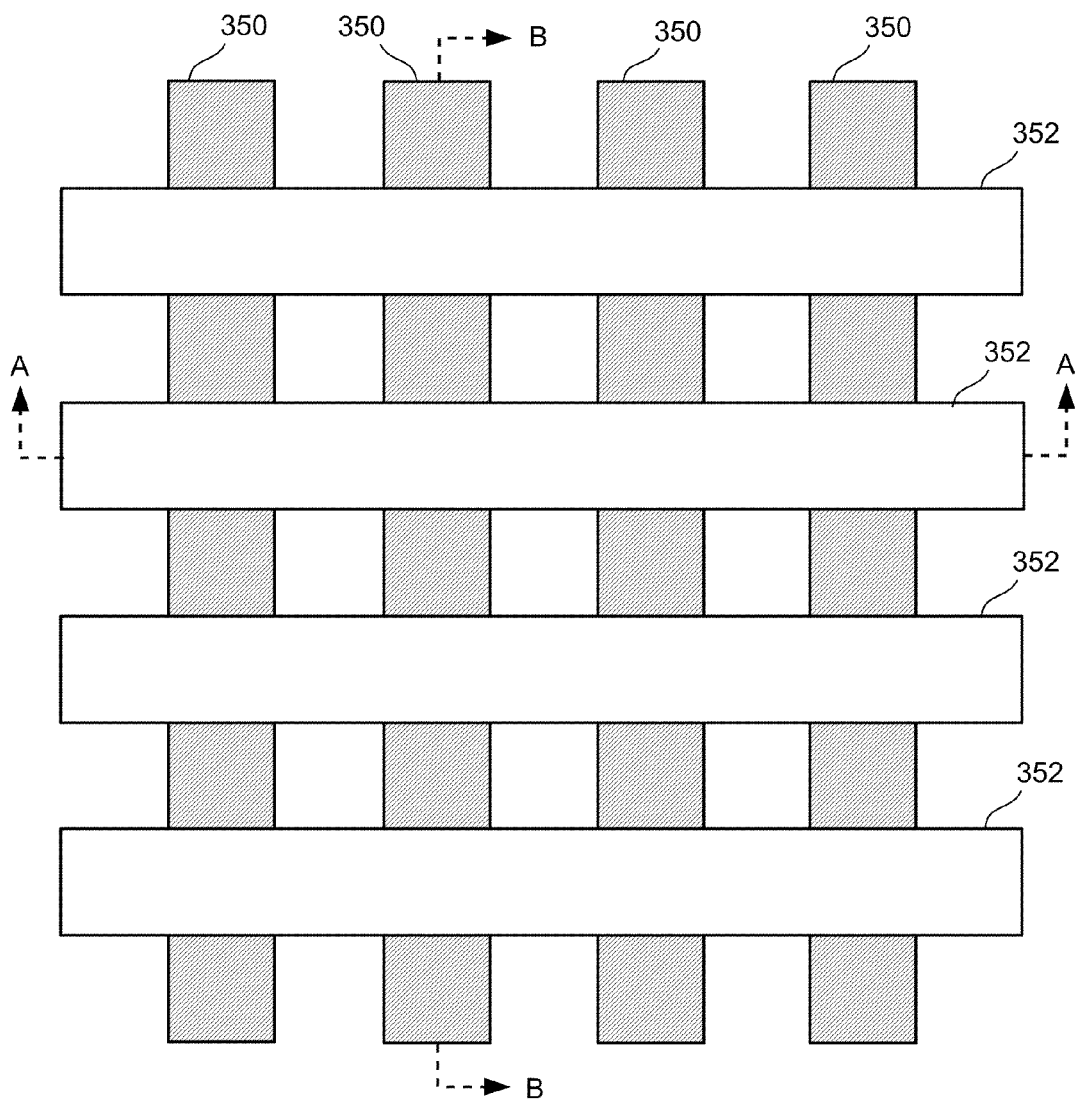
FIG. 3 depicts the structure of a non-volatile memory device.

FIG. 3 is a top view of a portion of an array of NAND flash memory cells. The array includes bit lines 350 and word lines 352. Note that FIG. 3 does not show all of the other details of the flash memory cells.

Note that a NAND string can have fewer or more memory cells than depicted in FIGS. 2 and 3. For example, some NAND strings will include eight memory cells, 16 memory cells, 32 memory cells, 64 memory cells, 128 memory cells, etc. The discussion herein is not limited to any particular number of memory cells in a NAND string. Furthermore, a wordline can have more or fewer memory cells than depicted in FIGS. 2 and 3. For example, a wordline can include thousand or tens of thousands of memory cells. The discussion herein is not limited to any particular number of memory cells in a wordline.

Each memory cell can store data (analog or digital). When storing one bit of digital data, the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after programming is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

In the case of storing multiple levels of data, the range of possible threshold voltages is divided into the number of levels of data. For example, if four levels of information is stored (two bits of data), there will be four threshold voltage ranges assigned to the data values "11", "10", "01", and "00." In one example of a NAND type memory, the threshold voltage after an erase operation is negative and defined as "11". Positive threshold voltages are used for the data states of "10", "01", and "00." If eight levels of information (or states) are stored (e.g. for three bits of data), there will be eight threshold voltage ranges assigned to the data values "000", "001", "010", "011", "100", "101", "110" and "111."

The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted or otherwise randomized to reduce data pattern sensitivity and even wear on the memory cells.

Relevant examples of NAND type flash memories and their operation are provided in the following U.S. Patents/Patent Applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348. The discussion herein can also apply to other types of flash memory in addition to NAND as well as other types of non-volatile memory. For example, the following patents describe NOR type flash memories and are incorporated herein by reference in their entirety: U.S. Pat. Nos. 5,095,344; 5,172,338; 5,890,192 and 6,151,248.

Figure 4A:
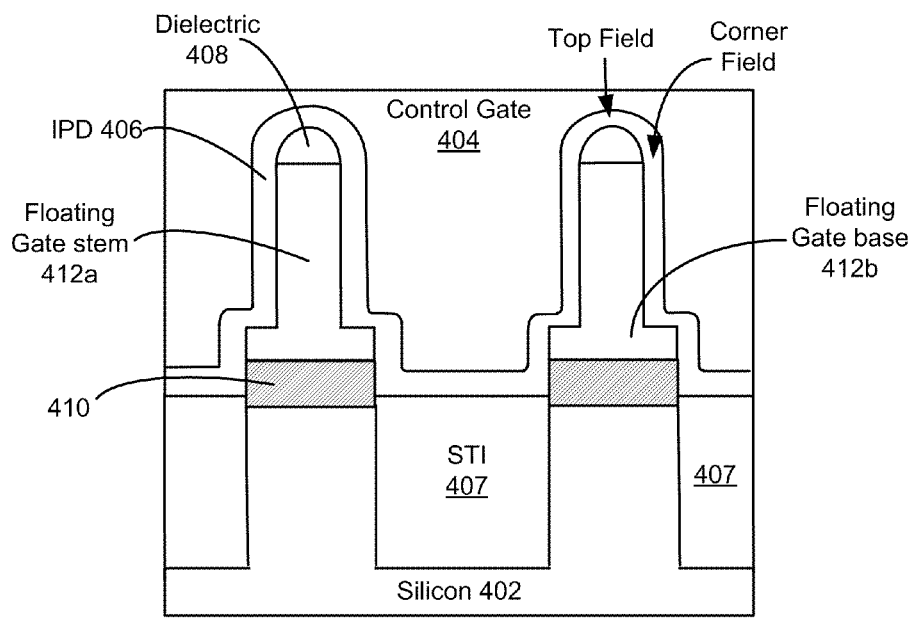
FIGS. 4A and 4B are plan views of a portion of a memory cell array.
Figure 4B:
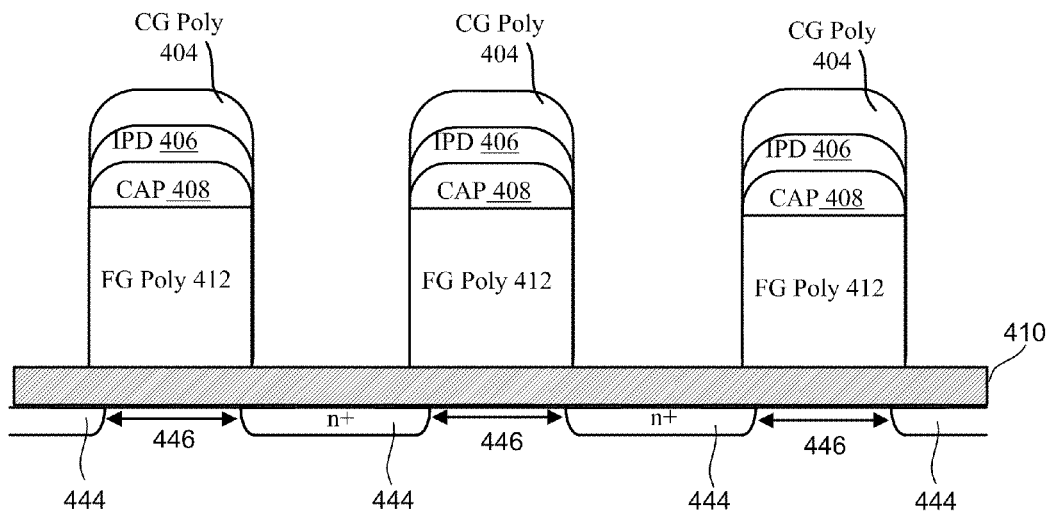

FIG. 4A and FIG. 4B are two-dimensional block diagrams of one embodiment of a portion of an array of non-volatile storage elements. FIG. 4A depicts a cross section of the memory array along cut A-A of FIG. 3 (cross section along word line). FIG. 4B depicts a cross section of the memory array along cut B-B of FIG. 3 (cross section along bit line). The memory cell of FIGS. 4A and 4B includes a triple well (not depicted in the figures) comprising a P substrate, an N-well and a P-well. Within the P-well are N+ diffusion regions 444, which serve as source/drains. Whether N+ diffusion regions 444 are labeled as source regions or drain regions is somewhat arbitrary; therefore, the source/drain regions 444 can be thought of as source regions, drain regions, or both. In a NAND string, a source/drain region 444 acts as a source for one memory cell while serving as a drain for an adjacent memory cell.

Between source/drain regions 444 is the channel 446. Above channel 446 is a first dielectric area 410, otherwise referred to as a gate oxide. In one embodiment, dielectric layer 410 is made of $SiO_2$. Other dielectric materials can also be used. Above dielectric layer 410 is floating gate 412. The floating gate, under low voltage operating conditions associated with read or bypass operations, is electrically insulated/isolated from channel 446 by dielectric layer 410. Floating gate 412 is typically made from poly-silicon that is doped with n-type dopants; however, other conducting materials, such as metals, can also be used. Above floating gate 412 is a dielectric cap 408. Above the top and around the sides of the floating gate 412 is a second dielectric layer 406, which is also referred to as an IPD 406. Above the IPD 406 is the polysilicon control gate 404. The control gate 404 can include additional layers of Tungsten Silicide (WSi) layer and Silicon Nitride (SiN) layer. A WSi layer is a lower resistance layer, whereas a SiN layer act as an insulator.

Dielectric layer 410, floating gate 412, dielectric cap 408, IPD 406, and control gate 404 comprise a floating gate stack. An array of memory cells will have many such floating gate stacks. In other embodiments, a floating gate stack may have more or fewer components than depicted in FIGS. 4A and 4B; however, a floating gate stack is so named because it includes a floating gate as well as other components.

Referring to FIG. 4A, shallow trench isolation (STI) structures 407 provide electrical insulation between strings of memory cells. In particular, an STI 407 separates the source/drain regions (not depicted in FIG. 4A) of one NAND string from the next. In one embodiment, the STI 407 are filled with $SiO_2$.

In FIGS. 4A and 4B, the floating gate has an "inverted T" shape. That is, the floating gate has a base 412b and a stem 412a. The inverted T shape helps to increase the area of the portions of the floating gate 412 that coincides with the control gate 404 while allowing for the floating gates 412 to be spaced closely together. In this example, a cross section of the floating gates parallel to the word line have an inverted T shape. In another embodiment, the inverted T-shape occurs along a cross section parallel to the bit line. For example, the floating gates in FIG. 4B would have an inverted T shape. However, the floating gates are not required to have an inverted T shape. In general, any floating gate with a top and sides that are separated by an IPD from a control gate may benefit from a dielectric cap over the top of the floating gate. However, floating gates having a relatively thin width in at least one direction may be more susceptible to problems of high electric fields in the IPD, and hence may receive a greater benefit from a dielectric cap.

It is not required that the stem 412a of the floating gate 412 have a relatively uniform width as depicted in FIG. 4A. In an alternative embodiment, the stem 412a of the floating gate is more narrow near the dielectric cap 408 than at the bottom near the base 412b of the floating gate.

Techniques are disclosed herein for reducing the strength of the electric field in certain regions of the IPD 406. One of the floating gates 412 has an arrow labeled "top field," which refers to the electrical field in the IPD 406 above the top of the floating gate 412. The arrow labeled "corner field" refers to the electrical field in the IPD 406 near the top corner of the floating gate 412. In some embodiments, the strength of the electrical field at the top of the floating gate 412 is reduced by the dielectric cap 408 such that it is less than (or at least no more than) the strength of the electrical field at the corner of the floating gate 412. However, it is not a requirement that the electrical field at the top of the floating gate 412 be weaker than the electrical field at the corner of the floating gate 412. For example, the dielectric cap 408 may serve to weaken the electrical field at the top of the floating gate 412 somewhat, but does not have to weaken the electrical field such that it is weaker than the electrical field at the corner of the floating gate 412. Reducing the strength of the electric field at the top of the floating gate can reduce overall leakage current without significantly impacting overall performance.

Figure 5:
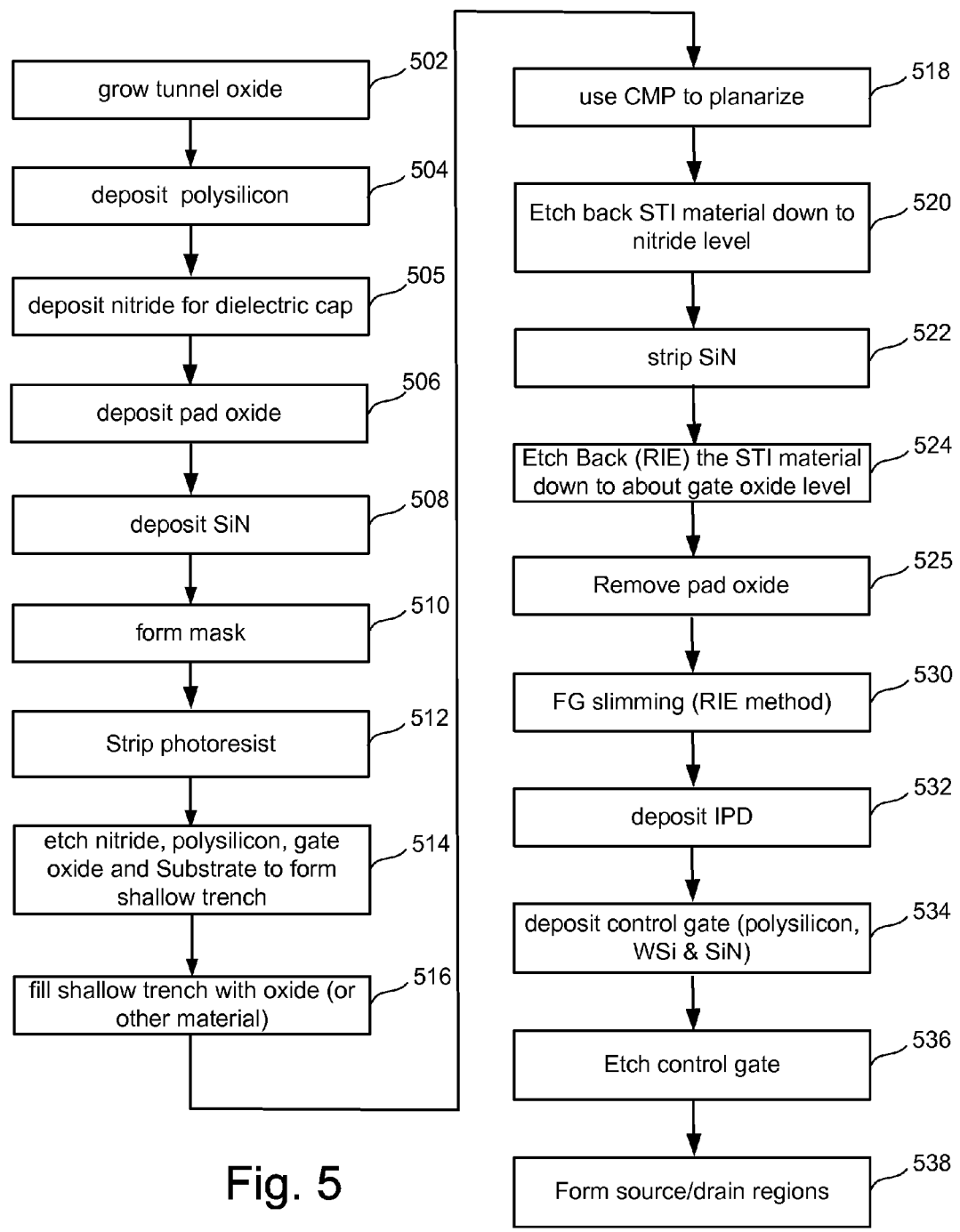
FIG. 5 is a flow chart describing one embodiment of a process for making a non-volatile memory cell array.

FIG. 5 is a flow chart describing one embodiment of a portion of the process for manufacturing the memory cells of FIGS. 4A and 4B. FIGS. 6A-6H depict the memory cells at various stages of the process. The process of FIG. 5 is described with respect to references numerals from FIGS. 4A and 4B and FIGS. 6A-6H. FIGS. 6A-6H depict a cross section along line A-A in FIG. 3. In this example, the upper portion of the floating gates are more narrow than the lower portions of the floating gates when viewed in a cross section parallel to the word line. However, note that the principles discussed herein apply to floating gates having a narrow upper portion when viewed in a cross section parallel to the bit line or both the word line and the bit line.

This flow chart does not describe all implant steps, or forming the contacts, metallizations, vias, and passivation, as well as other portions of the manufacturing process known in the art. There are many ways to manufacture memory according to the present invention and, thus, the inventors contemplate that various methods other than that described by FIG. 5 can be used. While a flash memory chip will include core memory and peripheral circuitry, the process steps of FIG. 5 are intended only to describe in general terms one possible process recipe for the fabrication of the core memory array.

Step 502 of FIG. 5 includes growing tunnel oxide layer 604 on top of a silicon substrate 402. The tunnel oxide layer 604 will be used to form gate dielectric layer 410. In step 504, a polysilicon layer 606 that is used to form the floating gate 412 is deposited over the oxide layer 604 using CVD (chemical vapor deposition), PVD (physical vapor deposition), ALD (atomic layer deposition) or another suitable method.

In step 505, a nitride layer 608 is grown on top of the polysilicon 606. This nitride layer 608 will be used to form the dielectric cap 408. In one embodiment, the nitride layer 608 is formed using SPA (slot plane antenna) nitridation. In one SPA technique, an antenna having a slot is used to distribute a nitride species. The configuration of the slot can be adjusted to result in a very uniform nitride layer on the polysilicon. Thus, the properties of the dielectric caps that are eventually formed will be consistent from one memory cell to the next. A variety of nitride species such as $N_2$, $NH_3$, and NO can be used. The nitride species reacts with the polysilicon 606 to form SiN. However, it is not required that the nitride be deposited using SPA. For example, the nitride could be deposited using CVD, PVD, ALD or another suitable method. Thus, as used here the term "forming nitride over polysilicon" includes techniques such as SPA in which a nitride species may react with silicon to form SiN or another compound, as well as techniques in which the nitride does not react with silicon.

Figure 6A:
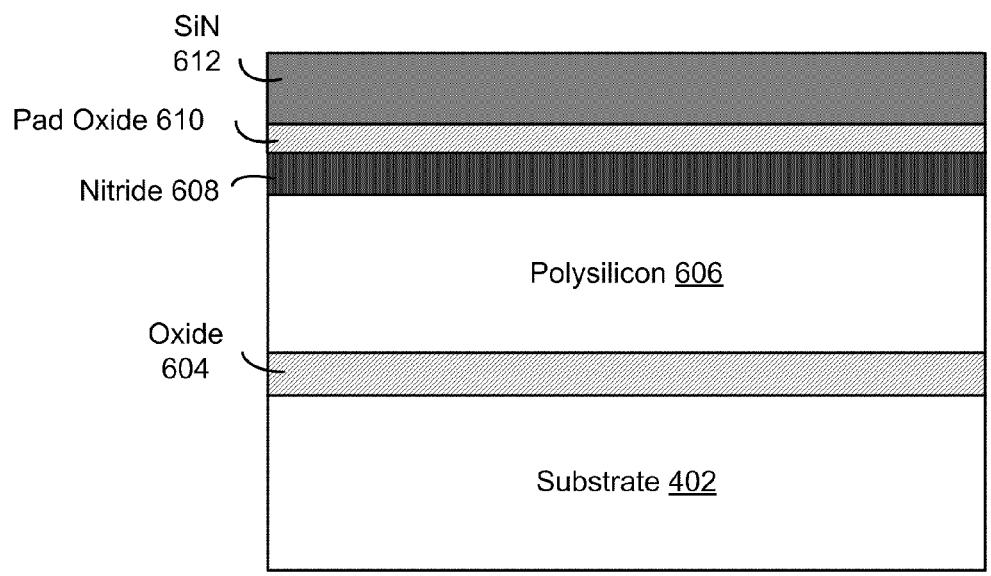
FIGS. 6A-6H depict a portion of a non-volatile memory cell array at various stages of the process described in FIG. 5.

In step 506, a pad oxide layer 610 is formed over the nitride 608. The pad oxide 608 will be used to protect the nitride 608, as will be discussed below. In step 508, a layer of SiN 612 is formed over the pad oxide layer 610. The results of steps 502-508 are depicted in FIG. 6A.

In step 510, a mask is formed from the SiN 612. Step 510 includes adding a photoresist and transferring a pattern of the photoresist to the SiN 612. For example an amorphous silicon pattern is defined using a spacer process. The silicon pattern is then transferred to the SiN 612. Step 510 includes etching the SiN 612 using anisotropic plasma etching, (i.e. reactive ion etching). After the SiN 612 is etched, the photoresist is stripped away, in step 512.

Figure 6B:
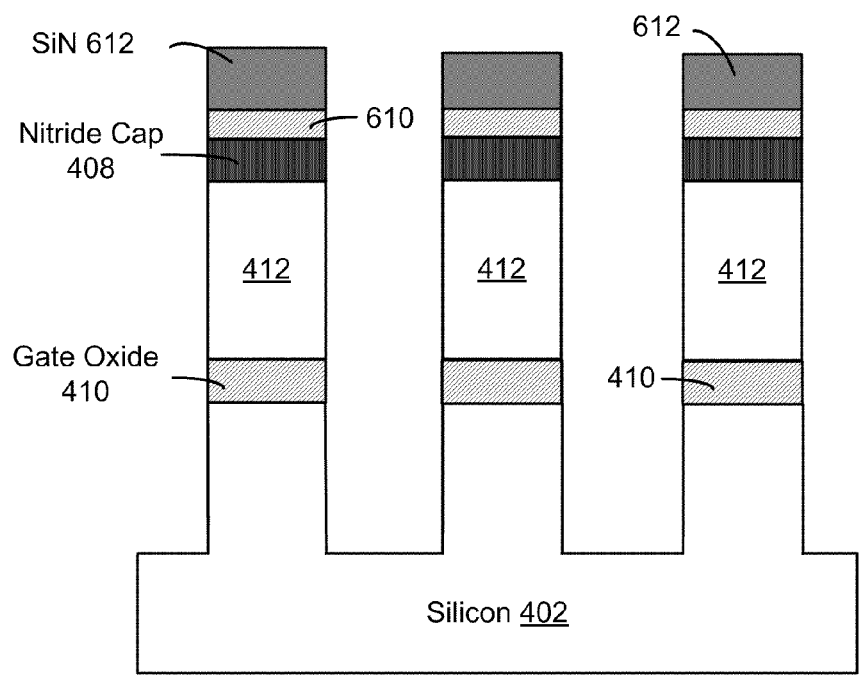

Next, the SiN mask 612 is used as a mask for etching the underlying layers, in step 514. For example, regions not covered by the SiN mask 612 are etched using anisotropic plasma etching, (i.e. reactive ion etching) with the proper balance between physical and chemical etching for each planar layer encountered. Techniques for stopping the etch at the appropriate depth are known in the art. Example techniques for stopping the etching of polysilicon can be found in U.S. patent application Ser. No. 11/960,485, entitled "Enhanced Endpoint Detection in Non-Volatile Memory Array Fabrication," filed on Dec. 19, 2007; and U.S. patent application Ser. No. 11/960,498, entitled "Composite Charge Storage Structure Formation In Non-Volatile Memory Using Etch Stop Technologies," filed on Dec. 19, 2007, both of which are incorporated herein by reference. The results of step 510-514 are depicted in FIG. 6B, which shows "pillars" of silicon substrate 402, gate oxide layer 410, polysilicon floating gate 412, nitride dielectric cap 408, pad oxide 610, and SiN mask 612 that remain after etching. The amorphous silicon pattern 612 is still in place at this time. The lower part of the empty region will serve as a shallow trench between the pillars. In one embodiment, the etch is approximately 0.2 microns into the substrate 402 to create shallow trench isolation (STI) areas between the NAND strings, where the bottom of the trenches are inside the top of the P-well. The upper part of the region between the pillars will eventually be filled with polysilicon to form a control gate.

Figure 6C:
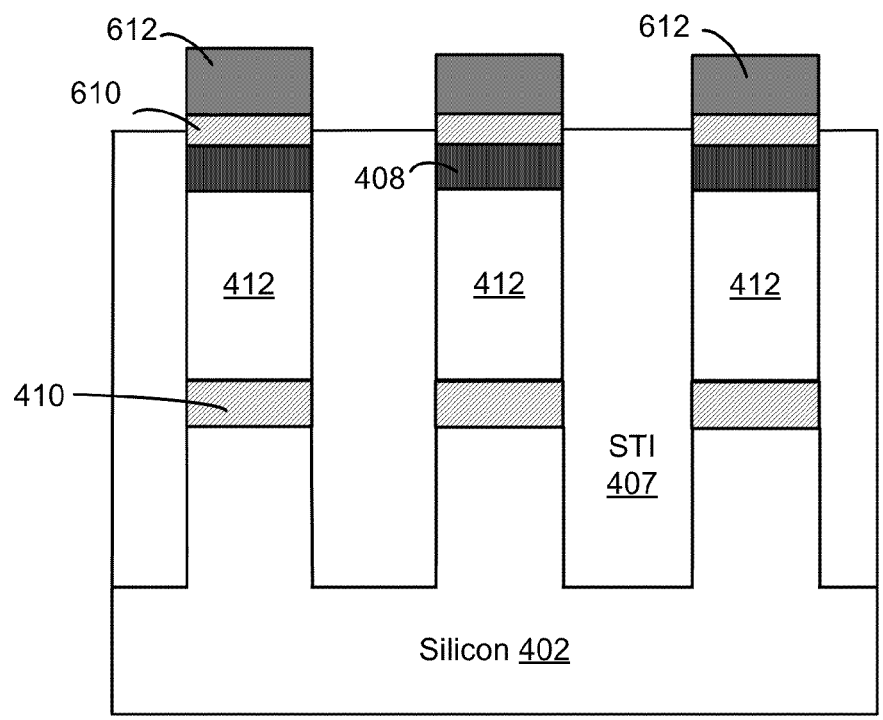

In step 516, the STI trenches are filled with isolation material 407 such as partially stabilized zirconia (PSZ), $SiO_2$ (or another suitable material) using CVD, rapid ALD or another method. In step 518, chemical mechanical polishing (CMP), or another suitable process, is used to polish the isolation material 407 flat until reaching the SiN 612. Step 520 is etching back the STI isolation material 407 down to about the pad oxide layer 610. The result of steps 516-520 is depicted in FIG. 6C, which depicts the STI material 407 at about the level of the pad oxide 610.

Figure 6D:
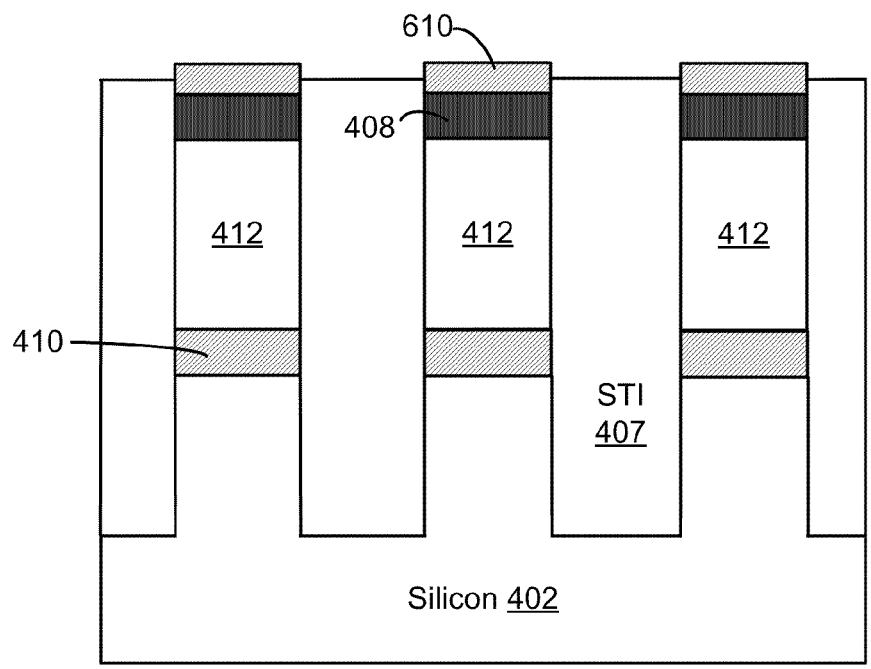

Step 522 is to strip the SiN 612 mask. FIG. 6D depicts results after step 522. In one embodiment, the SiN mask 612 is removed with a wet etch process. In one implementation, the etch is a hot H$_3$PO$_4$ etch. Note that because the STI material 407 is kept at about the level of the pad oxide 610, that the sides of the nitride dielectric cap 408 are protected when the SiN layer 612 is etched. Also note that the pad oxide 610 protects the top of the nitride 608 from being etched along with the SiN 612.

Figure 6E:
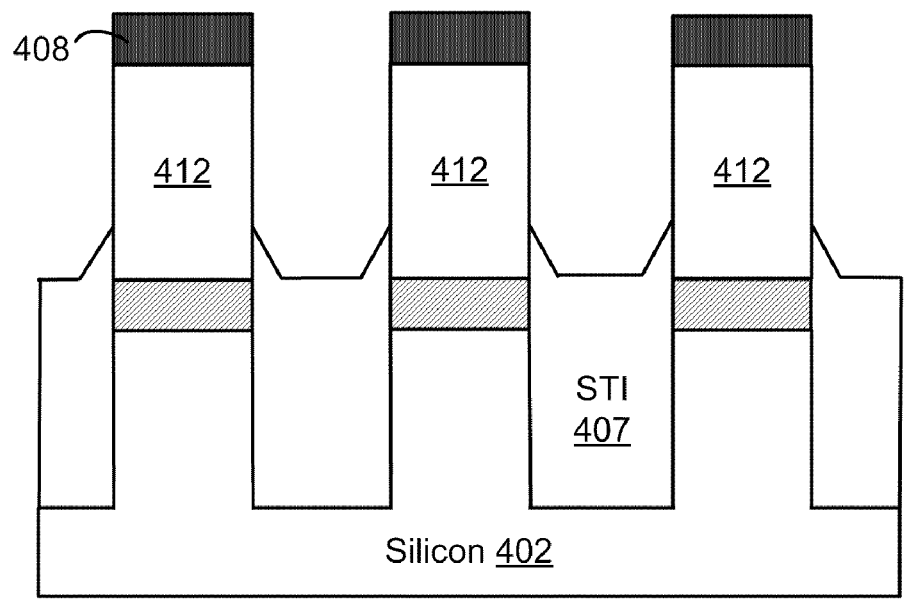

Step 524 is to etch back the STI material 407. In one embodiment, the etch is an RIE. The STI is etched back such that the STI material 407 still covers the sides of the lower portion of the polysilicon 412. The RIE of step 524 may remove some or all of the pad oxide 610. Step 525 removes any portion of the pad oxide 610 that might remain after etching back the STI material 407. FIG. 6E depicts results after step 525.

Figure 6F:
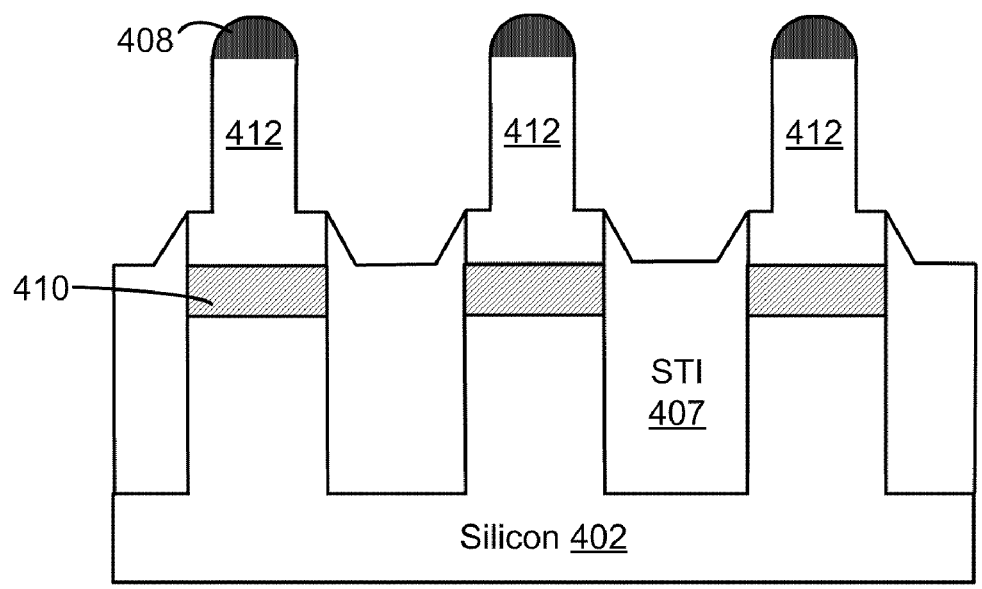

Step 530 is forming the upper portions 412a of the floating gates using RIE. The floating gates 412 in this embodiment have an upper portion 412a that more narrow than the lower portion 412b (at least in one direction). FIG. 6F depicts results after step 530. Note that the nitride 608 has been rounded as a result of the RIE. In one embodiment, the upper portions 412a of the floating gates are formed using an RIE slimming process in which an isotropic etch is performed using CF$_4$/O$_2$ gas chemistry with no substrate bias. However, other techniques can be used to form the upper portions 412a of the floating gates.

Figure 6G:
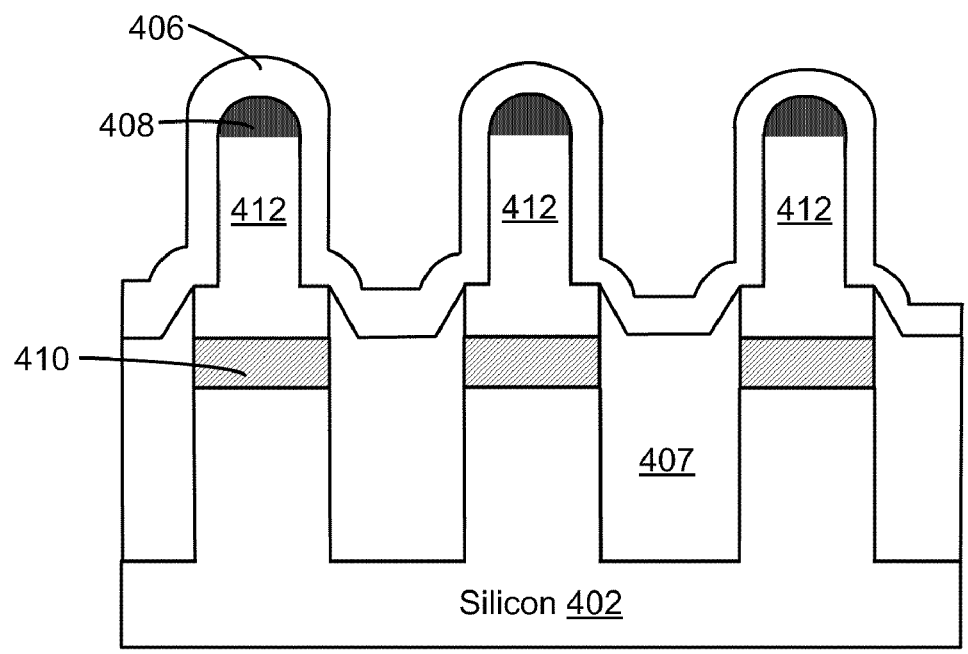

In step 532, the inter-poly dielectric (e.g. dielectric 406) is grown or deposited. The IPD may include alternating conformal layers of oxide and nitride. For example, an Oxide Nitride Oxide (ONO) inter-poly dielectric is used. In one embodiment, the IPD comprises nitride-oxide-nitride-oxide-nitride. The result of step 532 is depicted in FIG. 6G.

Figure 6H:
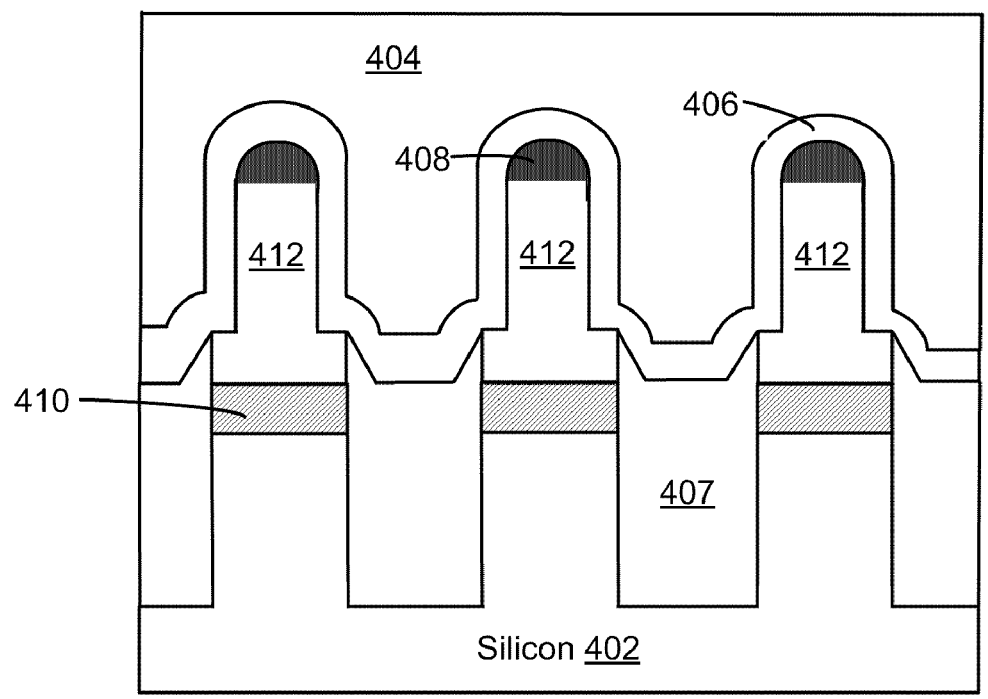

In step 534, the control gates (word lines) are deposited. Step 534 may include depositing a poly-silicon layer, a Tungsten Silicide (WSi) layer and a Silicon Nitride (SiN) layer. When forming the control gates photolithography is used to create patterns of strips perpendicular to the NAND chain, in order form word lines that are isolated from one another. The result of step 534 is depicted in FIG. 6H.

In step 536, etching of the control gate material 404 is performed using plasma etching, ion milling, ion etching that is purely physical etching, or another suitable process to etch the various layers and form the individual word lines.

In step 538, an implant process is performed to create the N+ source/drain regions 444. Arsenic or phosphorous implantation can be used. In one embodiment, a halo implant is also used. In some embodiments, an anneal process such as a rapid thermal anneal (RTA) is performed. Example parameters for RTA are heating to 1000 Celsius for ten seconds. FIG. 4A depicts a cross section of the memory array along cut A-A of FIG. 3 after step 538. FIG. 4B depicts a cross section of the memory array along cut B-B of FIG. 3 after step 538.

There are many alternatives to the above described structures and processes within the spirit of the present invention. As in the existing NAND embodiments, an alternative is to fabricate the memory cells from PMOS devices with opposite polarity bias conditions for the various operations as compared to the existing NMOS implementation. In the above examples, the substrate is made of silicon. However, other materials known in the art can also be used such as Gallium Arsenide, etc.

Reducing the strength of the electric field at the top of the floating gate may reduce overall leakage current substantially without significantly impacting overall performance. Note that while some dielectric material has been added in the IPD, the overall amount of dielectric is not increased much. Thus, the coupling between the floating gate and control gate is not severely impacted. Yet, the leakage current has been reduced in a region where it was the biggest problem.

Figure 7:
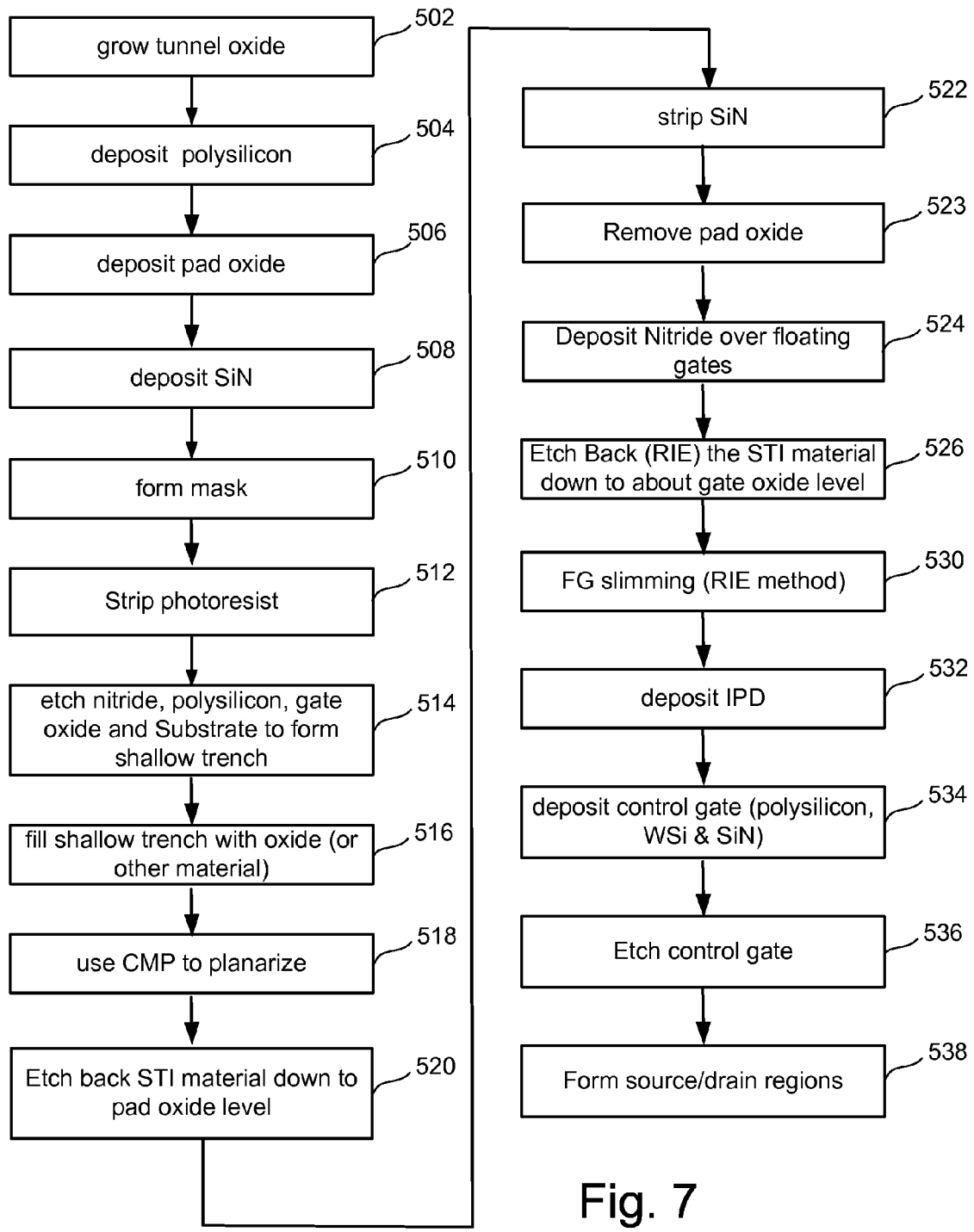
FIG. 7 is a flow chart describing one embodiment of a process for making a non-volatile memory cell array.

FIG. 7 is a flow chart describing one embodiment of a portion of the process for manufacturing the memory cell of FIGS. 4A and 4B. FIGS. 8A-8F depict various stages of formation in accordance with the process of FIG. 7. FIGS. 8A-8F depict a cross section along line A-A in FIG. 3. In this example, the floating gates are relatively narrow when viewed in a cross section parallel to the word line. However, note that the principles discussed herein apply to floating gates that are narrow when viewed in a cross section parallel to the bit line or both the word line and the bit line.

This flow chart does not describe all implant steps, or forming the contacts, metallizations, vias, and passivation, as well as other portions of the manufacturing process known in the art. There are many ways to manufacture memory according to the present invention and, thus, the inventors contemplate that various methods other than that described by FIG. 7 can be used. While a flash memory chip will include core memory and peripheral circuitry, the process steps of FIG. 7 are intended only to describe in general terms one possible process recipe for the fabrication of the core memory array. Many steps of the process of FIG. 7 are similar to the process and FIG. 5, and therefore will not be discussed again in detail.

Step 502 includes growing tunnel oxide layer 604 on top of a silicon substrate 402. In step 504, a polysilicon layer 606 that is used to form the floating gate 412 is deposited over the oxide layer 604 using CVD (chemical vapor deposition), PVD (physical vapor deposition), ALD (atomic layer deposition) or another suitable method.

Figure 8A:
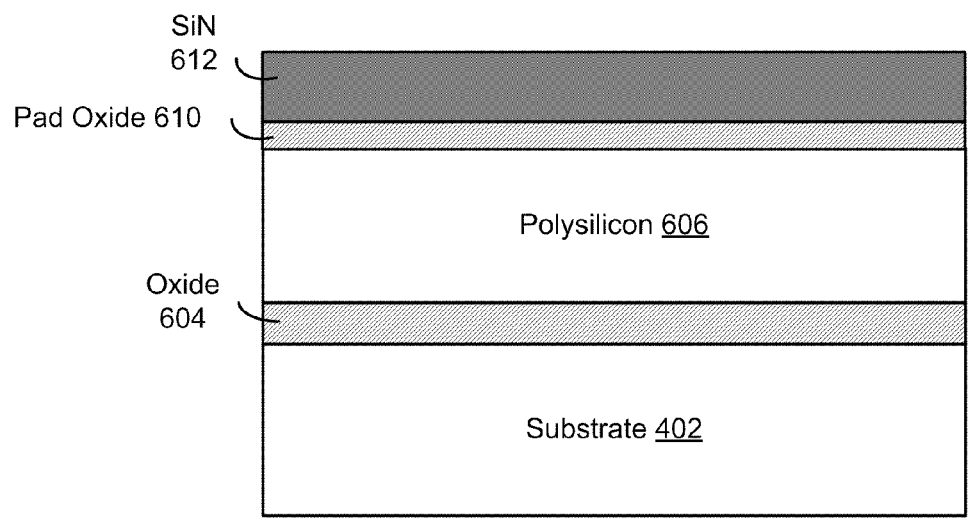
FIG. 8A-FIG. 8F illustrate non-volatile storage elements in various stages of the fabrication process of FIG. 7.

In the process of FIG. 7, unlike the process of FIG. 5, a nitride layer is not formed over the polysilicon layer 606 at this stage of forming the initial stack. In step 506, a pad oxide layer 610 is formed over the polysilicon layer 606. In step 508, a layer of SiN 612 is formed over the pad oxide layer 610. The results of steps 502-508 are depicted in FIG. 8A.

Figure 8B:
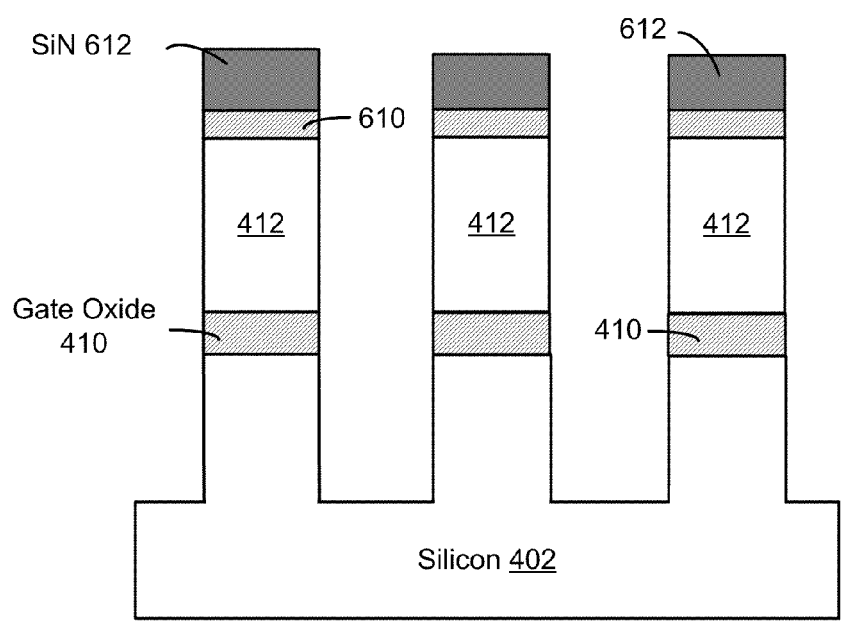

In step 510, a mask is formed from the SiN 612. After the SiN 612 is etched to form the mask, photoresist used to form the mask is stripped away, in step 512. Next, the SiN mask 612 is used as a mask for etching the underlying layers, in step 514. The results of step 510-514 are depicted in FIG. 8B, which shows "pillars" of silicon substrate 402, gate oxide layer 410, polysilicon floating gate 412, pad oxide 610, and SiN mask 612 that remain after etching. The amorphous silicon pattern 612 is still in place at this time.

Figure 8C:
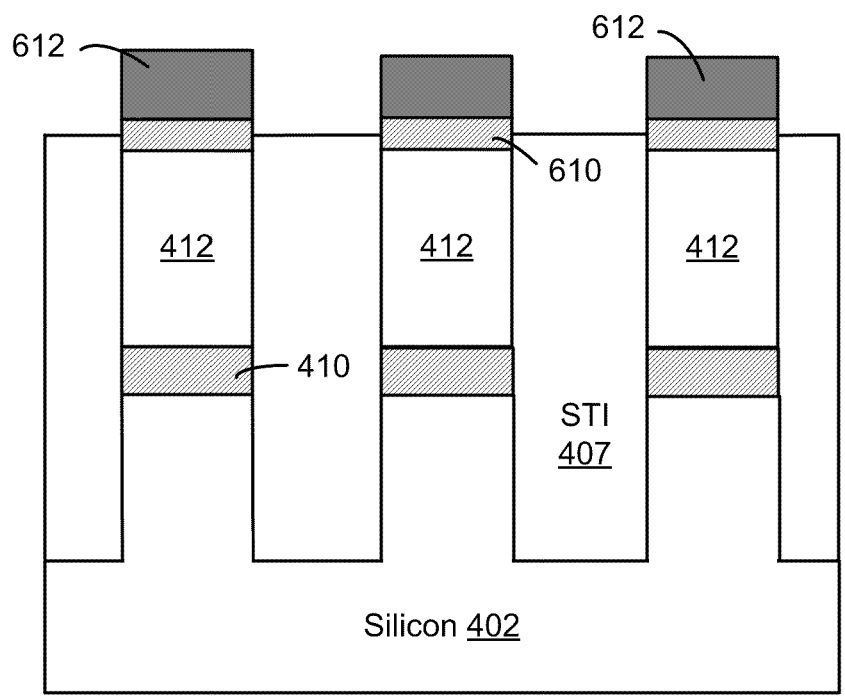

In step 516, the STI trenches are filled with isolation material 407 such as partially stabilized zirconia (PSZ), SiO$_2$ (or another suitable material) using CVD, rapid ALD or another method. In step 518, chemical mechanical polishing (CMP), or another suitable process, is used to polish the isolation material 407 flat until reaching the SiN 612. Step 520 is etching back the STI isolation material 407 down to about the pad oxide layer 610. The result after steps 516-520 is depicted in FIG. 8C, which depicts the STI material 407 at about the level of the pad oxide 610.

Figure 8D:
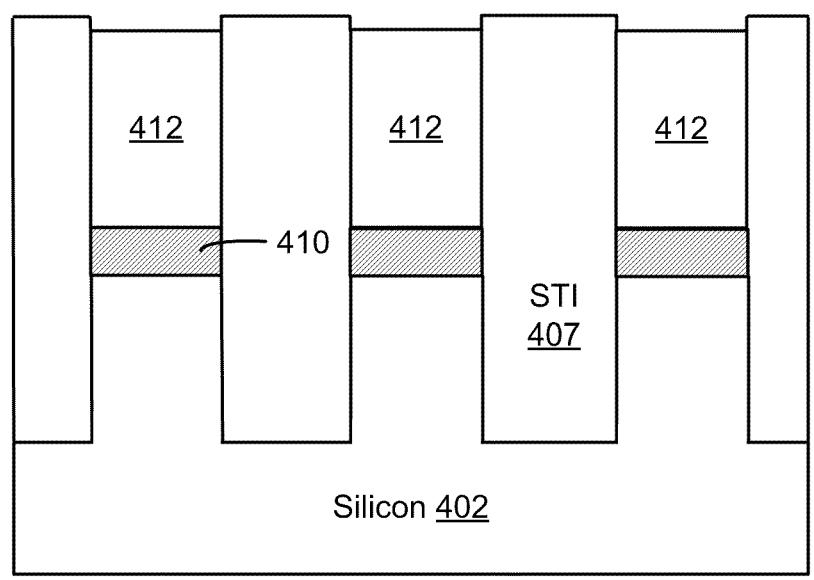

Step 522 is to strip the SiN 612 mask. Step 523 is to strip the pad oxide 610. FIG. 8D depicts results after step 523.

Figure 8E:
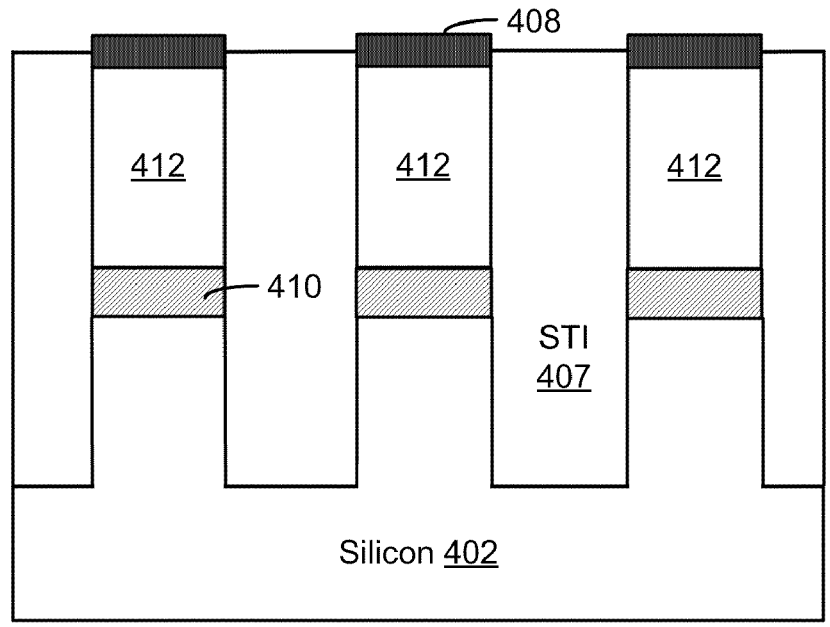

Step 524 is to selectively form nitride to the tops of the floating gates 412. In one embodiment, the nitride is formed using SPA nitridation which can be used to selectively form nitride at the tops of the polysilicon floating gates 412 without forming nitride over the STI material 407. The result after step 524 is depicted in FIG. 8E.

Step 526 is to etch back the STI material 407. In one embodiment, the etch is an RIE. The result after step 526 is depicted in FIG. 8E, which depicts the STI material 407 etched back such that the STI material 407 still covers the sides of the lower portion 412*b* of the polysilicon floating gates 412.

Step 530 is forming the upper portions 412*a* of the floating gates using RIE. The floating gates in this embodiment have an upper portion 412*a* that more narrow than the lower portion 412*b* (at least in one direction). FIG. 6F depicts results after step 530. Note that the nitride 608 has been rounded as a result of the RIE. In one embodiment, the upper portions 412*a* of the floating gates are formed using an RIE slimming process in which an isotropic etch is performed using $CF_4/O_2$ gas chemistry with no substrate bias. However, other techniques can be used to form the upper portions 412*a* of the floating gates.

In step 532, the inter-poly dielectric (e.g. dielectric 406) is grown or deposited. The result of step 532 is depicted in FIG. 6G.

In step 534, the control gates (word lines) are deposited. The result of step 534 depicted in FIG. 6H. In step 536, etching is performed using plasma etching, ion milling, ion etching that is purely physical etching, or another suitable process to etch the various layers and form the individual word lines.

In step 538, an implant process is performed to create the N+ source/drain regions 444. FIG. 4A depicts a cross section of the memory array along cut A-A of FIG. 3 after step 534. FIG. 4B depicts a cross section of the memory array along cut B-B of FIG. 3 after step 534.

Figure 9:
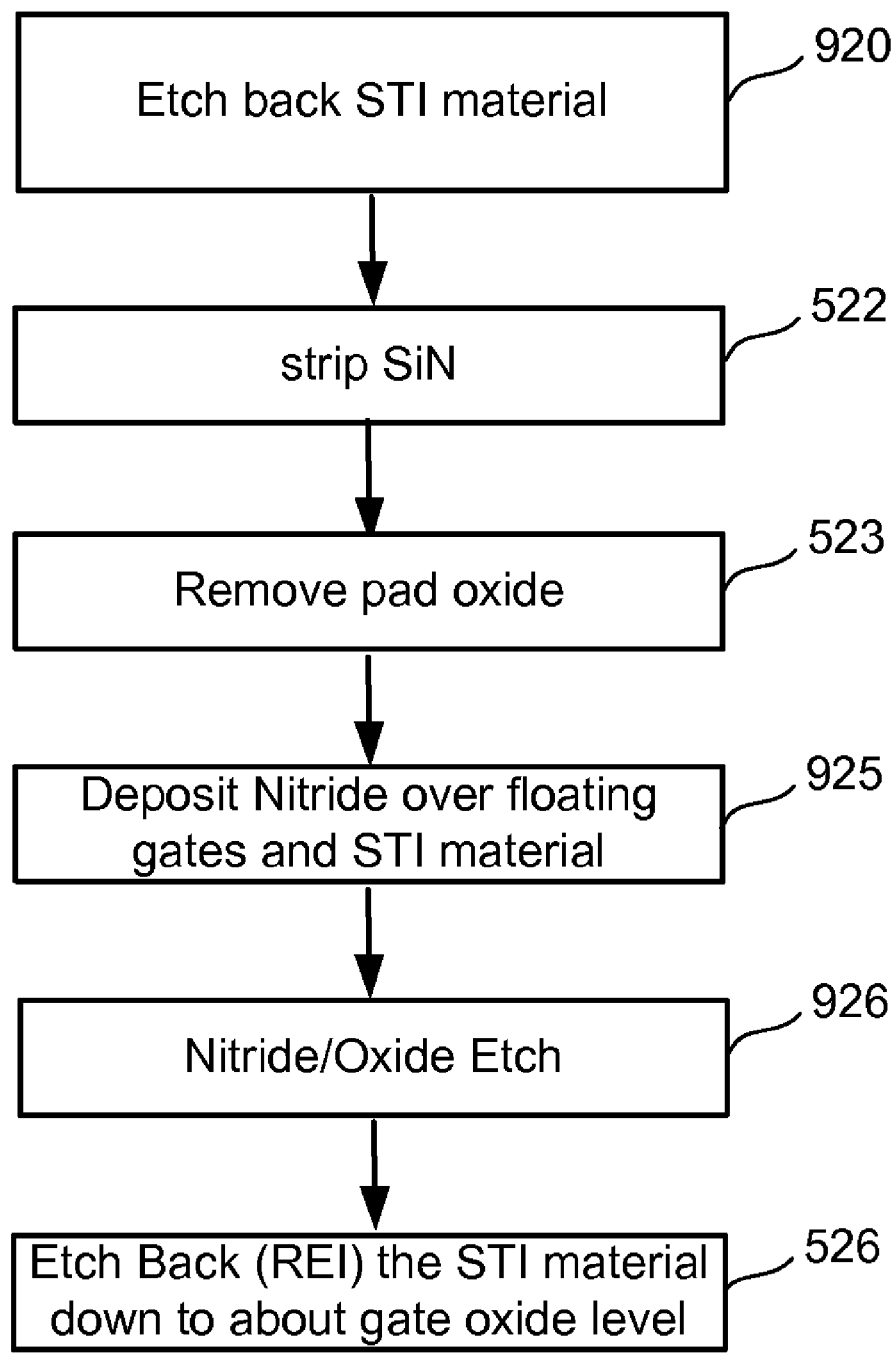
FIG. 9 is a flow chart describing one embodiment of a process for making a non-volatile memory cell array.
Figure 10A:
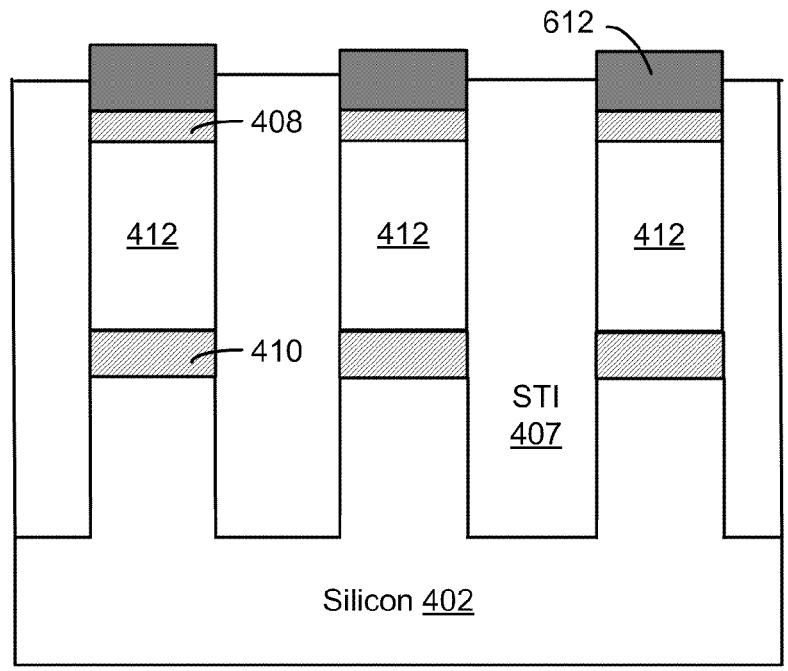
FIG. 10A-FIG. 10C illustrate non-volatile storage elements in various stages of the fabrication process of FIG. 9.
Figure 10B:
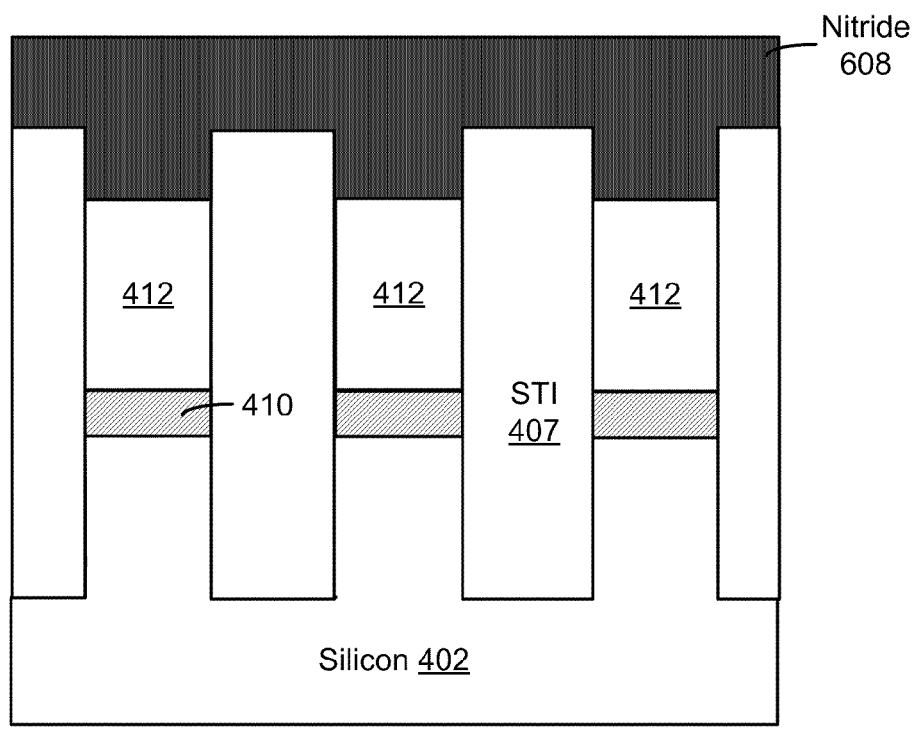
Figure 10C:
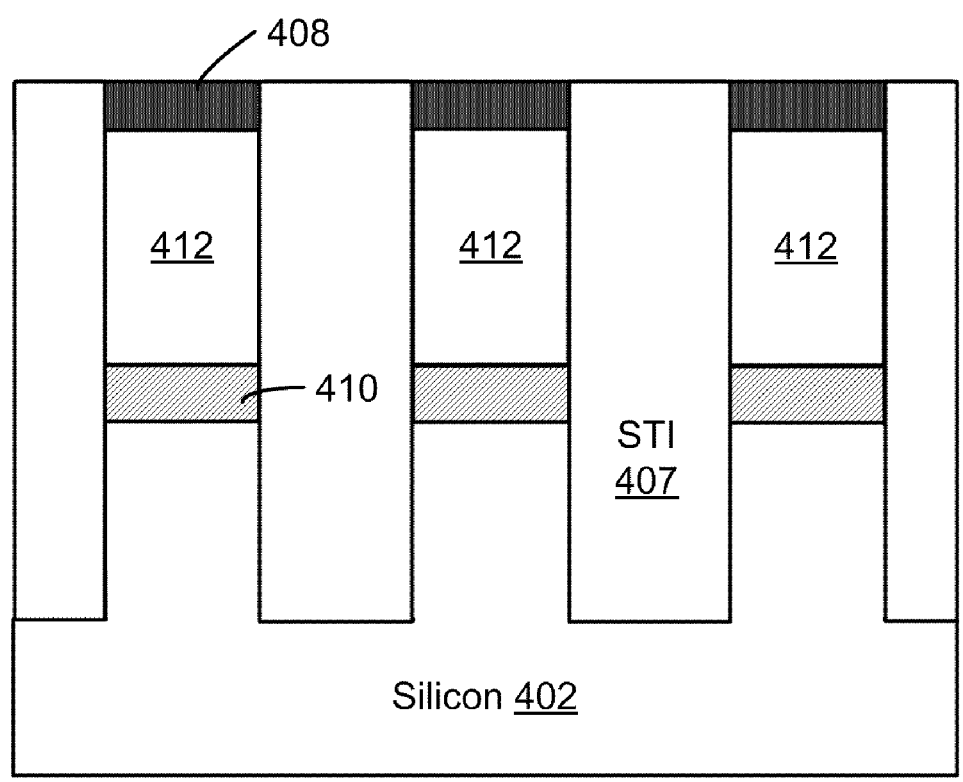

FIG. 9 a flow chart describing one embodiment of a portion of the process for manufacturing the memory cell of FIGS. 4A and 4B. FIGS. 10A-10C depict various stages of formation in accordance with the process of FIG. 9. FIGS. 10A-10C depict a cross section along line A-A in FIG. 3. In this example, the floating gates are relatively narrow when viewed in a cross section parallel to the word line. However, note that the principles discussed herein apply to floating gates that are narrow when viewed in a cross section parallel to the bit line or both the word line and the bit line.

This flow chart does not describe all implant steps, or forming the contacts, metallizations, vias, and passivation, as well as other portions of the manufacturing process known in the art. There are many ways to manufacture memory according to the present invention and, thus, the inventors contemplate that various methods other than that described by FIG. 9 can be used. While a flash memory chip will include core memory and peripheral circuitry, the process steps of FIG. 9 are intended only to describe in general terms one possible process recipe for the fabrication of the core memory array.

Many steps of the process of FIG. 9 are similar to the process and FIG. 7, and therefore will not be discussed again in detail. Prior to step 920 in FIG. 9, processing is similar to steps 502-518 of the process of FIG. 7. In step 920 of the process of FIG. 9, the STI material 407 is etched. In this embodiment, the STI material 407 is not etched down to the pad oxide level 610. Rather, etching of the STI material 407 steps when the STI material 407 is still at the SiN layer 612. FIG. 10A shows the results after step 920.

In steps 522 and 524 the SiN 612 and the pad oxide 610 are removed. These steps are similar to the process of FIG. 7. In step 925, nitride is formed above both the polysilicon floating gates 412 and the STI material 407. This is different from the process of FIG. 7 in that in that process the nitride was formed selectively at the surface of the polysilicon floating gates 412 but not over the STI material 407. FIG. 10B depicts results after step 925. In this embodiment, the nitride can be deposited by CVD, PVD, or another technique.

In step 926, a nitride/oxide etch is performed to etch back both the nitride and the STI material 407. FIG. 10C depicts results after step 926 in which nitride dielectric caps 408 reside over polysilicon floating gates 412, but not over STI material 407.

Figure 8F:
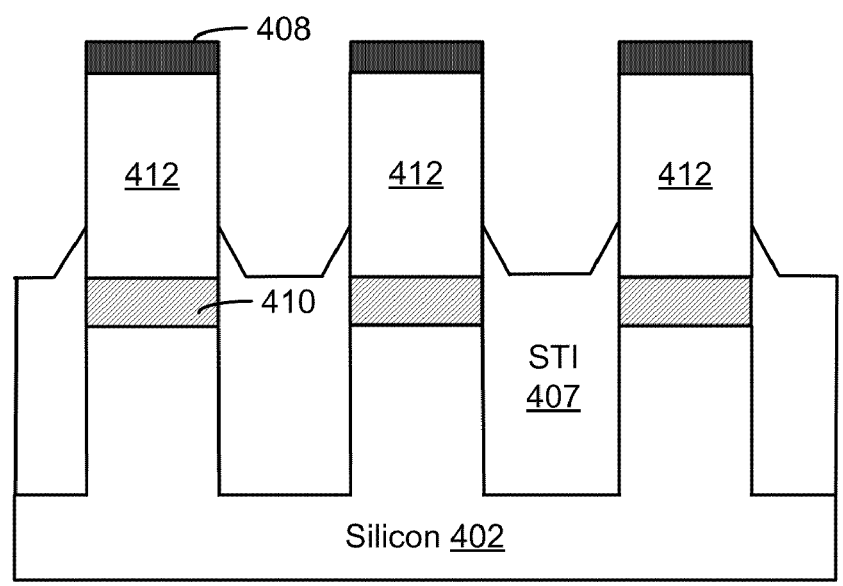

Then, the STI material 407 is etched back in step 526. Step 526 is similar to the corresponding step in the process of FIG. 7. FIG. 8F depicts results after step 526. Processing then continues as described in the flow of FIG. 7.

Figure 11:
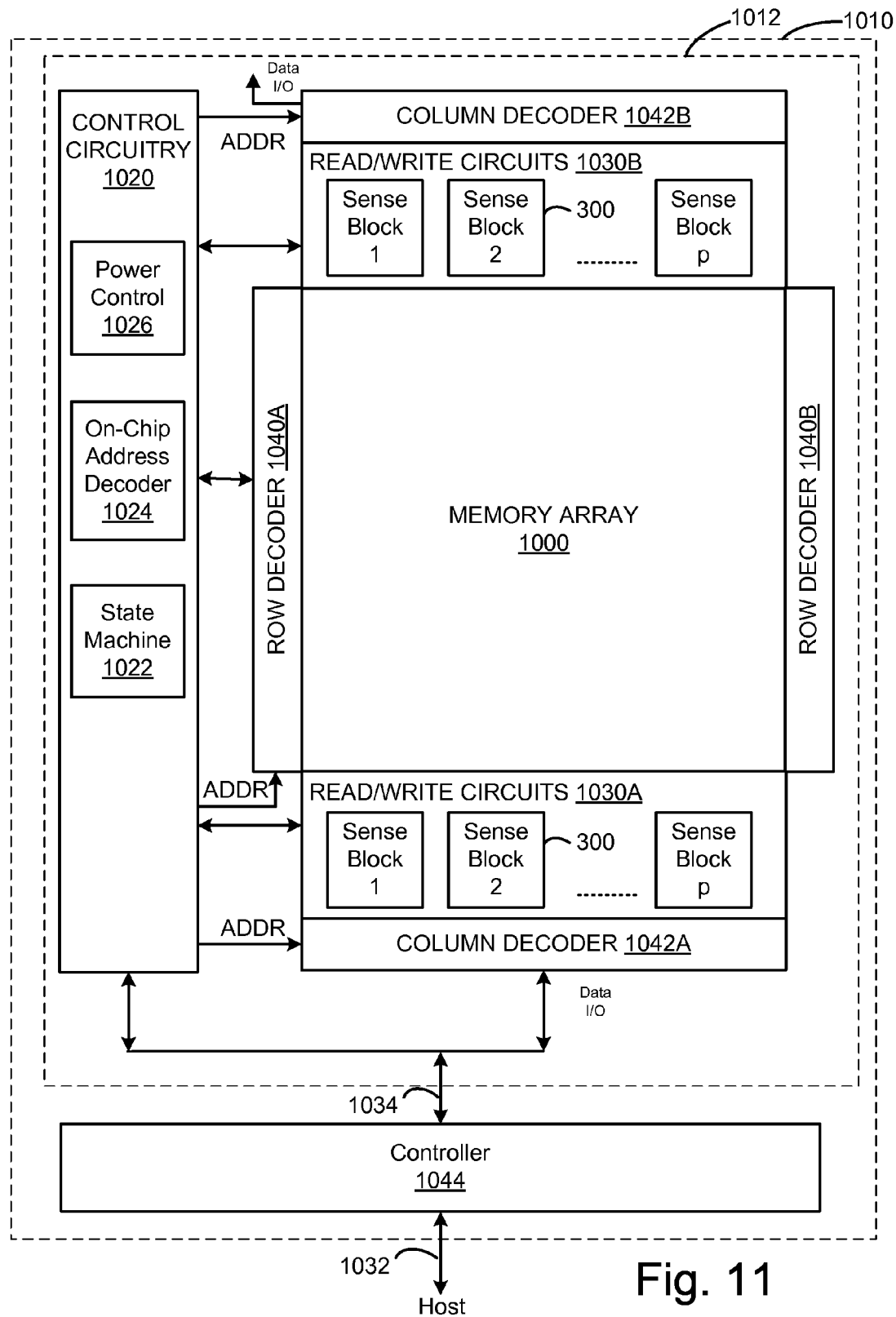
FIG. 11 is a block diagram of a non-volatile memory system.

FIG. 11 illustrates a non-volatile storage device 1010 that may include one or more memory die or chips 1012. Memory die 1012 includes an array (two-dimensional or three dimensional) of memory cells 1000, control circuitry 1020, and read/write circuits 1030A and 1030B. In one embodiment, access to the memory array 1000 by the various peripheral circuits is implemented in a symmetric fashion, on opposite sides of the array, so that the densities of access lines and circuitry on each side are reduced by half. The read/write circuits 1030A and 1030B include multiple sense blocks 300 which allow a page of memory cells to be read or programmed in parallel. The memory array 100 is addressable by word lines via row decoders 1040A and 1040B and by bit lines via column decoders 1042A and 1042B. In a typical embodiment, a controller 1044 is included in the same memory device 1010 (e.g., a removable storage card or package) as the one or more memory die 1012. Commands and data are transferred between the host and controller 1044 via lines 1032 and between the controller and the one or more memory die 1012 via lines 1034. One implementation can include multiple chips 1012.

Control circuitry 1020 cooperates with the read/write circuits 1030A and 1030B to perform memory operations on the memory array 1000. The control circuitry 1020 includes a state machine 1022, an on-chip address decoder 1024 and a power control module 1026. The state machine 1022 provides chip-level control of memory operations. The on-chip address decoder 1024 provides an address interface to convert between the address that is used by the host or a memory controller to the hardware address used by the decoders 1040A, 1040B, 1042A, and 1042B. The power control module 1026 controls the power and voltages supplied to the word lines and bit lines during memory operations. In one embodiment, power control module 1026 includes one or more charge pumps that can create voltages larger than the supply voltage.

In one embodiment, one or any combination of control circuitry 1020, power control circuit 1026, decoder circuit 1024, state machine circuit 1022, decoder circuit 1042A, decoder circuit 1042B, decoder circuit 1040A, decoder circuit 1040B, read/write circuits 1030A, read/write circuits 1030B, and/or controller 1044 can be referred to as one or more managing circuits.

Figure 12:
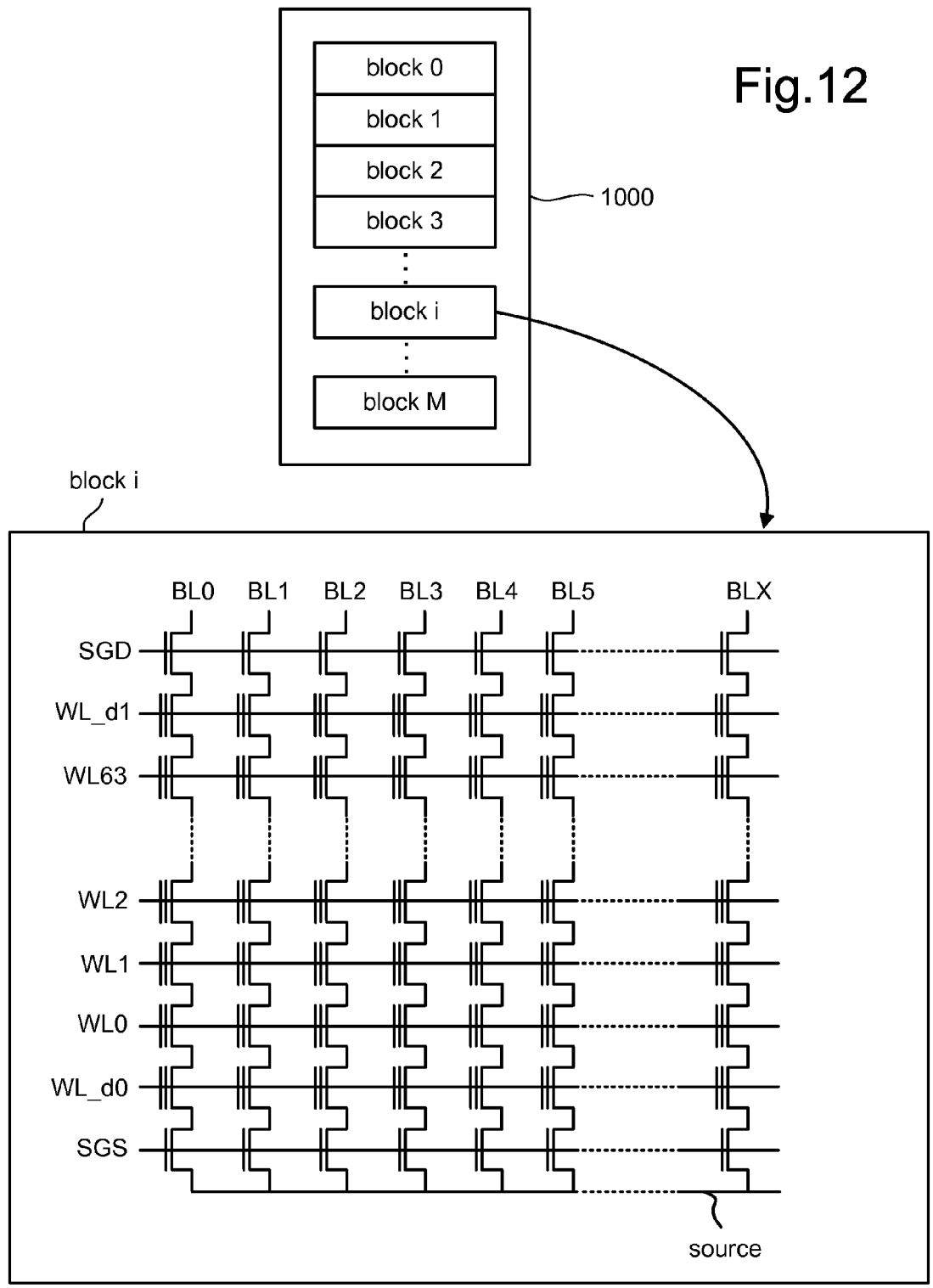
FIG. 12 is a block diagram depicting one embodiment of a memory array.

FIG. 12 depicts an exemplary structure of memory cell array 1000. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 12 shows more details of block i of memory array 1000. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or less than 64 data memory cells and two dummy memory cells. Data memory cells can store user or system data. Dummy memory cells are typically not used to store user or system data. Some embodiments do not include dummy memory cells.

Figure 13:
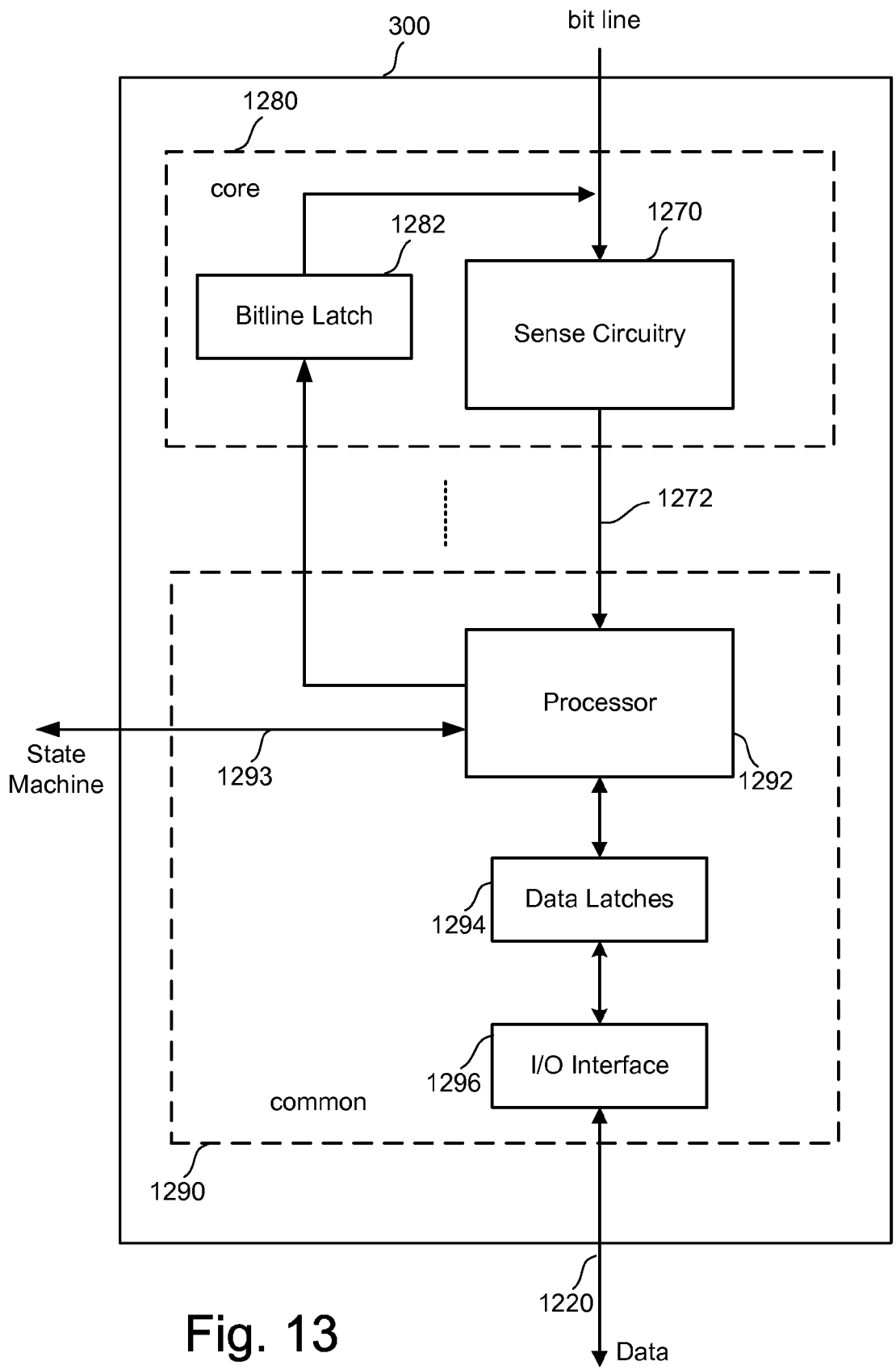
FIG. 13 is a block diagram depicting one embodiment of a sense block.

FIG. 13 is a block diagram of an individual sense block 300 partitioned into a core portion, referred to as a sense module 1280, and a common portion 1290. In one embodiment, there will be a separate sense module 1280 for each bit line and one common portion 1290 for a set of multiple sense modules 1280. In one example, a sense block will include one common portion 1290 and eight sense modules 1280. Each of the sense modules in a group will communicate with the associated common portion via a data bus 1272. For further details, refer to U.S. Patent Application Publication 2006/0140007, which is incorporated herein by reference in its entirety.

Sense module 1280 comprises sense circuitry 1270 that determines whether a conduction current in a connected bit line is above or below a predetermined threshold level. In some embodiments, sense module 1280 includes a circuit commonly referred to as a sense amplifier. Sense module 1280 also includes a bit line latch 1282 that is used to set a voltage condition on the connected bit line. For example, a predetermined state latched in bit line latch 1282 will result in the connected bit line being pulled to a state designating program inhibit (e.g., Vdd).

Common portion 1290 comprises a processor 1292, a set of data latches 1294 and an I/O Interface 1296 coupled between the set of data latches 1294 and data bus 1220. Processor 1292 performs computations. For example, one of its functions is to determine the data stored in the sensed memory cell and store the determined data in the set of data latches. The set of data latches 1294 is used to store data bits determined by processor 1292 during a read operation. It is also used to store data bits imported from the data bus 1220 during a program operation. The imported data bits represent write data meant to be programmed into the memory. I/O interface 1296 provides an interface between data latches 1294 and the data bus 1220.

During read or sensing, the operation of the system is under the control of state machine 1022 that controls the supply of different control gate voltages to the addressed cell. As it steps through the various predefined control gate voltages corresponding to the various memory states supported by the memory, the sense module 1280 may trip at one of these voltages and an output will be provided from sense module 1280 to processor 1292 via bus 1272. At that point, processor 1292 determines the resultant memory state by consideration of the tripping event(s) of the sense module and the information about the applied control gate voltage from the state machine via input lines 1293. It then computes a binary encoding for the memory state and stores the resultant data bits into data latches 1294. In another embodiment of the core portion, bit line latch 1282 serves double duty, both as a latch for latching the output of the sense module 1280 and also as a bit line latch as described above.

It is anticipated that some implementations will include multiple processors 1292. In one embodiment, each processor 1292 will include an output line (not depicted in FIG. 12) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 1292 to accumulate the results of the associated bit lines such that the state machine need only read the wired-OR line one time.

During program or verify, the data to be programmed is stored in the set of data latches 1294 from the data bus 1220. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 1292 monitors the verified memory state relative to the desired memory state. When the two are in agreement, processor 1292 sets the bit line latch 1282 so as to cause the bit line to be pulled to a state designating program inhibit. This inhibits the cell coupled to the bit line from further programming even if it is subjected to programming pulses on its control gate. In other embodiments the processor initially loads the bit line latch 1282 and the sense circuitry sets it to an inhibit value during the verify process.

Data latch stack 1294 contains a stack of data latches corresponding to the sense module. In one embodiment, there are 3-5 (or another number) data latches per sense module 1280. In one embodiment, the latches are each one bit. In some implementations (but not required), the data latches are implemented as a shift register so that the parallel data stored therein is converted to serial data for data bus 1220, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

The foregoing detailed description of embodiments of the invention has been presented for purposes of illustration and description. It is not intended to be exhaustive or to limit the invention to the precise form disclosed. Many modifications and variations are possible in light of the above teaching. The described embodiments were chosen in order to best explain the principles of embodiments of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for forming non-volatile storage, the method comprising:
    forming a layer of gate oxide above a substrate;
    forming a layer of polysilicon floating gate material over the gate oxide;
    forming nitride over at least a portion of the polysilicon floating gate material;
    forming a plurality of floating gates from the polysilicon floating gate material, the forming a plurality of floating gates includes performing a first etch of the polysilicon floating gate material to form pillars, the first etch defines the width of a lower portion of each floating gate;
    forming individual dielectric caps from the nitride, each individual nitride dielectric cap is self-aligned with one of the plurality of floating gates, forming the floating gates and forming the individual dielectric caps includes etching the pillars and the nitride to form an upper portion of each floating gate, a first of the individual dielectric caps is self-aligned with a first of the upper portions of a first of the floating gates as a result of etching the pillars;
    forming an inter-gate dielectric layer over the dielectric caps and the sides of the floating gates; and
    forming control gates over the dielectric caps, the inter-gate dielectric layer separates the control gates from the floating gates.

2. A method as recited in claim 1, wherein the forming nitride includes forming the nitride by SPA (slot plane antenna) nitridation.

3. A method as recited in claim 1, wherein the forming nitride includes forming a layer of nitride over the polysilicon floating gate material.

4. A method as recited in claim 3, wherein the forming a layer of nitride over the polysilicon floating gate material includes forming silicon nitride, at least a portion of the silicon in the silicon nitride is from the polysilicon floating gate material.

5. A method as recited in claim 1, further comprising:
    depositing insulating material in shallow trench isolation regions between the pillars, wherein the forming nitride over at least a portion of the polysilicon floating gate material includes:
    forming nitride regions selectively over the top surfaces of the remaining portions of the polysilicon floating gate material but not over the insulating material.

6. A method as recited in claim 1, further comprising:
    depositing insulating material in shallow trench isolation regions between the pillars, wherein the forming nitride over at least a portion of the polysilicon floating gate material includes:
    forming a nitride layer over the top surfaces of the remaining portions of the polysilicon floating gate material and over the insulating material; and
    etching the nitride layer and the insulating material to form nitride caps over the top surfaces of the remaining portions of the polysilicon floating gate material but not over the insulating material, the nitride caps are slimmed when etching the pillars.

7. A method for forming non-volatile storage, the method comprising:
    forming a layer of gate oxide above a substrate;
    forming a layer of polysilicon floating gate material over the gate oxide;
    etching portions of the polysilicon floating gate material, the gate oxide, and the substrate to form shallow trench isolation regions and pillars, the shallow trench isolation regions separating the pillars, the pillars comprising remaining portions of the polysilicon floating gate material and gate oxide, the remaining portions of the polysilicon floating gate material having top surfaces and sides, the etching portions of the polysilicon floating gate material, the gate oxide, and the substrate to form shallow trench isolation regions and pillars defines a lower portion of each floating gate;
    depositing insulating material in the shallow trench isolation regions;
    forming nitride regions selectively over the top surfaces of the remaining portions of the polysilicon floating gate material but not over the insulating material, the forming nitride regions is performed after the etching portions of the polysilicon floating gate material;
    performing an additional etch after forming the nitride regions, the additional etch defines an upper portion of each floating gate, remaining portions of the nitride regions are self-aligned to the upper portions of the floating gates as a result, individual ones of the floating gates include an upper portion and a lower portion, the lower portion having a first width and the upper portion having a second width, the first width is greater than the second width;
    forming an inter-gate dielectric layer over the nitride regions and the sides of the floating gates; and
    forming control gates over the nitride regions, the inter-gate dielectric layer separates the control gates from the floating gates.

8. A method as recited in claim 7, wherein the forming nitride regions selectively over the top surfaces of the remaining portions of the polysilicon floating gate material but not over the insulating material includes depositing the nitride nitride layer by SPA (slot plane antenna) nitridation.

9. A method for forming non-volatile storage, the method comprising:
    forming a layer of gate oxide above a substrate;
    forming a layer of polysilicon floating gate material over the gate oxide;
    forming a plurality of floating gates from the polysilicon floating gate material, the floating gates have sides, forming the plurality of floating gates includes etching portions of the polysilicon floating gate material, the layer of gate oxide, and the substrate to form shallow trench isolation regions and pillars, the shallow trench isolation regions separating the pillars, the pillars comprising remaining portions of the polysilicon floating gate material and the gate oxide, the remaining portions of the polysilicon floating gate material having top surfaces;

depositing insulating material in the shallow trench isolation regions;

depositing a nitride layer over the top surfaces of the remaining portions of the polysilicon floating gate material and over the insulating material, the depositing a nitride layer is performed after the pillars are formed;

forming individual dielectric caps from the nitride layer, each individual nitride dielectric cap is self-aligned with one of the plurality of floating gates, forming the individual nitride dielectric caps includes etching the nitride layer and the insulating material to form nitride regions over the top surfaces of the remaining portions of the polysilicon floating gate material but not over the insulating material;

wherein the forming a plurality of floating gates and the forming individual dielectric caps includes etching the pillars and the nitride regions to form upper portions of the floating gates, a first of the individual dielectric caps is self-aligned with a first of the upper portions of a first of the floating gates as a result of etching the pillars, each of the floating gates includes an upper portion and a lower portion, the lower portion having a first width and the upper portion having a second width, the first width is greater than the second width;

forming an inter-gate dielectric layer over the individual nitride dielectric caps and the sides of the floating gates; and forming control gates over the individual nitride dielectric caps, the inter-gate dielectric layer separates the control gates from the floating gates.

10. A method as recited in claim 9, wherein the etching the pillars and the nitride regions to form the upper portions of the floating gates results in individual dielectric caps that are rounded at the top.

11. A method for forming non-volatile storage, the method comprising:
   forming a layer of gate oxide above a substrate;
   forming a layer of polysilicon floating gate material over the gate oxide;
   forming a layer of nitride over the polysilicon floating gate material;
   forming a pad oxide layer over the layer of nitride;
   forming a mask over the pad oxide layer;
   etching portions of the polysilicon floating gate material and the layer of nitride to form floating gates with nitride caps, the floating gates each having at least two sides and the nitride caps each having a surface, the etching includes etching the layer of polysilicon floating material, the layer of nitride, and the pad oxide layer based on the mask to form shallow trenches;
   depositing insulating material in the shallow trenches;
   removing the mask after depositing the insulating material;
   removing the pad oxide layer after removing the mask;
   wherein the etching portions of the polysilicon floating gate material and the layer of nitride to form floating gates with nitride caps further includes etching the polysilicon floating gate material and the layer of nitride after removing the pad oxide to form upper portions of the floating gates, the nitride caps are self-aligned to the upper portions of the floating gates as a result, individual ones of the floating gates include an upper portion and a lower portion, the lower portion having a first width and the upper portion having a second width, the first width is greater than the second width;
   forming an inter-gate dielectric layer over the surface of the nitride caps and the at least two sides of the floating gates; and
   forming control gates over the nitride caps, the inter-gate dielectric layer separates the control gates from the floating gates.

12. A method as recited in claim 11, wherein the forming a layer of nitride includes forming the nitride by SPA (slot plane antenna) nitridation.

13. A method for as recited in claim 11, wherein the forming a layer of nitride over the polysilicon floating gate material includes forming silicon nitride, at least a portion of the silicon in the silicon nitride is from the polysilicon floating gate material.

* * * * *

UNITED STATES PATENT AND TRADEMARK OFFICE
CERTIFICATE OF CORRECTION

PATENT NO. : 8,207,036 B2  Page 1 of 1
APPLICATION NO. : 12/242857
DATED : June 26, 2012
INVENTOR(S) : Purayath et al.

It is certified that error appears in the above-identified patent and that said Letters Patent is hereby corrected as shown below:

On Title Page 2; Item [56] Other Publications, please change "Notice of Allowance and Fee(s) Due dated Jan. 18, 2011, U.S. Appl. No. 12/170,321, filed Jul. 9, 2008" should be --Notice of Allowance and Fee(s) Due dated Jan. 18, 2011, U.S. Appl. No. 12/170,327, filed Jul. 9, 2008--.

On Title Page 2; Item [56] Other Publications, please change "Response B to Office Action dated Dec. 29, 2010, U.S. Appl. No 12/170,321, filed Jul. 9, 2008" should be --Response B to Office Action dated Dec. 29, 2010, U.S. Appl. No 12/170,327, filed Jul. 9, 2008--.

In the Claims

Column 16, (claim 8, line 4), please delete "nitride" after the.

Column 18, (claim 13, line 1), please delete "for" after method.

Signed and Sealed this
Eleventh Day of June, 2013

Teresa Stanek Rea
*Acting Director of the United States Patent and Trademark Office*

UNITED STATES PATENT AND TRADEMARK OFFICE
CERTIFICATE OF CORRECTION

PATENT NO. : 8,207,036 B2  Page 1 of 1
APPLICATION NO. : 12/242857
DATED : June 26, 2012
INVENTOR(S) : Purayath et al.

It is certified that error appears in the above-identified patent and that said Letters Patent is hereby corrected as shown below:

On Title Page 2; Item [56] Other Publications, please change "Notice of Allowance and Fee(s) Due dated Jan. 18, 2011, U.S. Appl. No. 12/170,321, filed Jul. 9, 2008" should be --Notice of Allowance and Fee(s) Due dated Jan. 18, 2011, U.S. Appl. No. 12/170,327, filed Jul. 9, 2008--.

On Title Page 2; Item [56] Other Publications, please change "Response B to Office Action dated Dec. 29, 2010, U.S. Appl. No 12/170,321, filed Jul. 9, 2008" should be --Response B to Office Action dated Dec. 29, 2010, U.S. Appl. No 12/170,327, filed Jul. 9, 2008--.

In the Claims

Column 16, line 57 (claim 8, line 4), please delete "nitride" after the.

Column 18, line 38 (claim 13, line 1), please delete "for" after method.

This certificate supersedes the Certificate of Correction issued June 11, 2013.

Signed and Sealed this
Second Day of July, 2013

Teresa Stanek Rea
*Acting Director of the United States Patent and Trademark Office*